US011646081B2

(12) United States Patent
Yang et al.

(10) Patent No.: US 11,646,081 B2
(45) Date of Patent: May 9, 2023

(54) RELIABILITY COMPENSATION FOR UNEVEN NAND BLOCK DEGRADATION

(71) Applicant: SanDisk Technologies LLC, Addison, TX (US)

(72) Inventors: Xiang Yang, Santa Clara, CA (US); Peter Rabkin, Cupertino, CA (US); Henry Chin, Fremont, CA (US); Ken Oowada, Fujisawa (JP); Dengtao Zhao, Santa Clara, CA (US); Gerrit Jan Hemink, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/392,500

(22) Filed: Aug. 3, 2021

(65) Prior Publication Data

US 2023/0041476 A1 Feb. 9, 2023

(51) Int. Cl.

| G11C 16/04 | (2006.01) |
| G11C 16/10 | (2006.01) |
| G11C 16/34 | (2006.01) |
| G11C 11/56 | (2006.01) |
| H01L 27/11565 | (2017.01) |
| H01L 25/065 | (2023.01) |
| H01L 27/11582 | (2017.01) |

(52) U.S. Cl.
CPC .......... *G11C 16/10* (2013.01); *G11C 11/5671* (2013.01); *G11C 16/0483* (2013.01); *G11C 16/349* (2013.01); *H01L 25/0657* (2013.01); *H01L 27/11565* (2013.01); *H01L 27/11582* (2013.01); *H01L 2225/06562* (2013.01)

(58) Field of Classification Search
CPC ................ G11C 16/10; G11C 11/5671; G11C 16/0483; G11C 16/349; H01L 25/0657; H01L 27/11565; H01L 27/11582; H01L 2225/06562
USPC ...................................................... 365/185.03
See application file for complete search history.

(56) References Cited

U.S. PATENT DOCUMENTS

| 8,300,463 B2 * | 10/2012 | Park ................... G11C 16/3495 365/185.11 |
| 8,305,812 B2 | 11/2012 | Levy et al. |
| 8,358,538 B2 | 1/2013 | Moschiano et al. |
| 8,446,766 B2 | 5/2013 | Park et al. |
| 8,886,990 B2 | 11/2014 | Meir et al. |
| 9,189,386 B2 | 11/2015 | Wakrat et al. |
| 9,569,143 B1 | 2/2017 | Sehgal et al. |

(Continued)

*Primary Examiner* — Tha-O H Bui
(74) *Attorney, Agent, or Firm* — Vierra Magen Marcus LLP

(57) ABSTRACT

Technology is provided for extending the useful life of a block of memory cells by changing an operating parameter in a physical region of the block that is more susceptible to wear than other regions. Changing the operating parameter in the physical region extends the life of that region, which extends the life of the block. The operating parameter may be, for example, a program voltage step size or a storage capacity of the memory cells. For example, using a smaller program voltage step size in a sub-block that is more susceptible to wear extends the life of that sub-block, which extends the life of the block. For example, programming memory cells to fewer bits per cell in the region of the block (e.g., sub-block, word line) that is more susceptible to wear extends the useful life of that region, which extends the life of the block.

13 Claims, 23 Drawing Sheets

(56) References Cited

U.S. PATENT DOCUMENTS

| | | |
|---|---|---|
| 9,760,303 B2 | 9/2017 | Ea et al. |
| RE46,995 E | 8/2018 | Mokhlesi |
| 10,229,751 B2 | 3/2019 | Avraham et al. |
| 10,235,057 B2 | 3/2019 | Rothberg |
| 10,269,435 B1 * | 4/2019 | Chen .................. H01L 27/1157 |
| 10,613,781 B2 | 4/2020 | Melik-Martirosian |
| 10,748,619 B1 | 8/2020 | Li |
| 2011/0292724 A1 * | 12/2011 | Kim ...................... G11C 16/10 |
| | | 365/185.03 |
| 2015/0003156 A1 | 1/2015 | Berckmann et al. |
| 2015/0187442 A1 | 7/2015 | Sivasankaran et al. |
| 2020/0202926 A1 | 6/2020 | Chiang |

\* cited by examiner

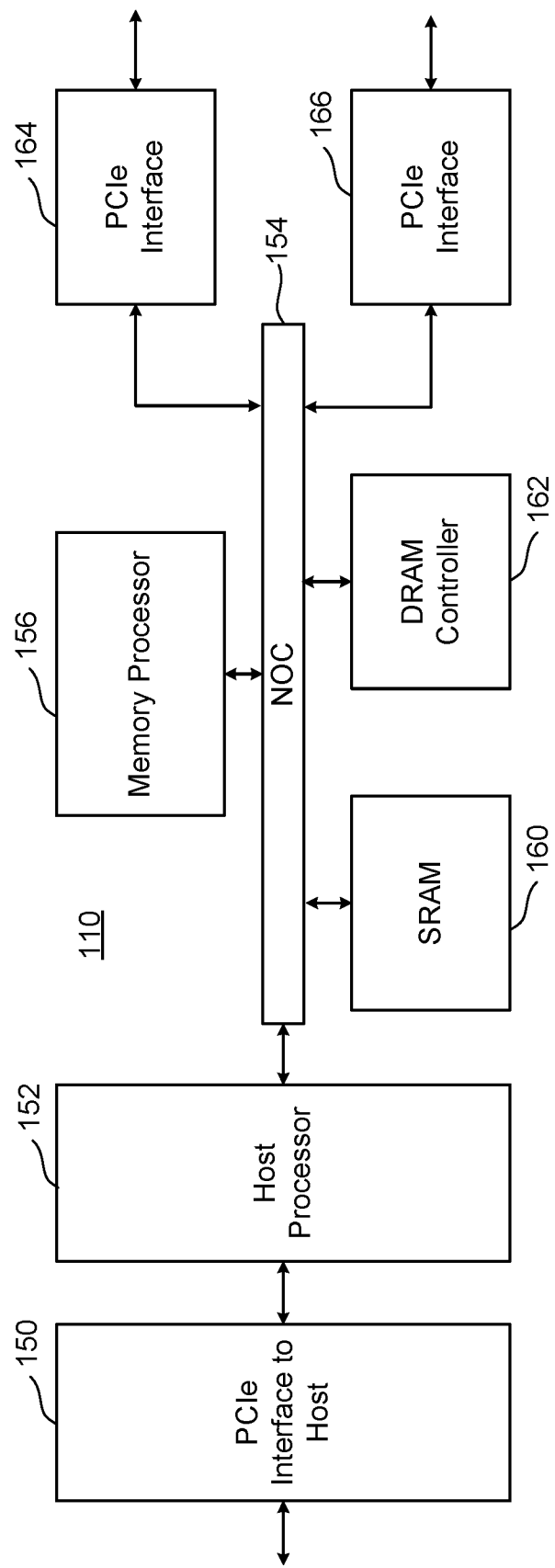

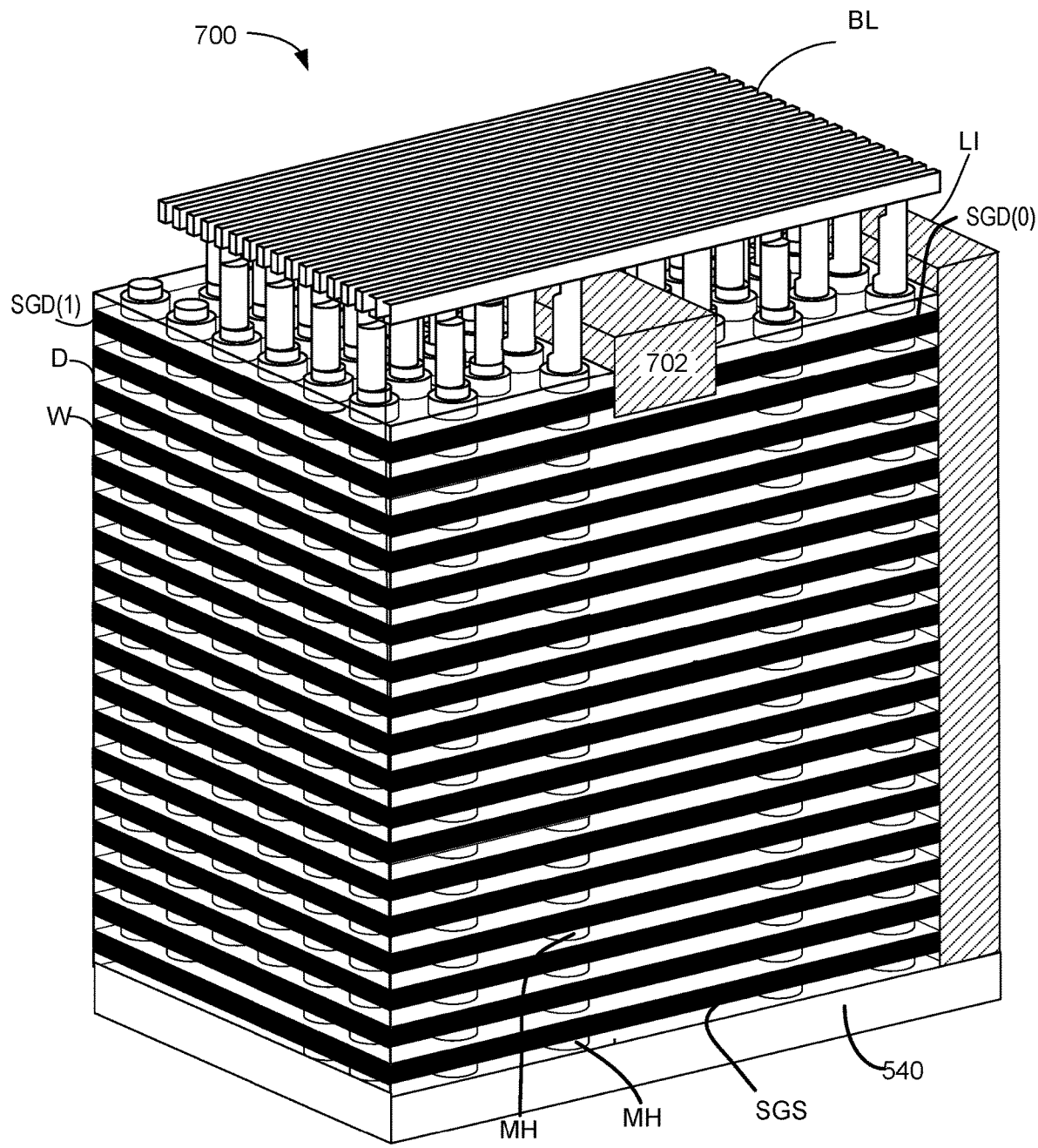

RELIABILITY COMPENSATION FOR UNEVEN NAND BLOCK DEGRADATION

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line.

In an example, the memory device is a charge-trapping memory device. A charge-trapping memory device may use a charge-trapping material such as silicon nitride or other nitride, or in a multi-layer configuration such as an oxide-nitride-oxide (O—N—O) configuration. The charge-trapping material is separated from a channel layer by a tunneling layer. For example, a charge-trapping memory device may be a 3D memory device in which a stack of alternating conductive and dielectric layers are formed. Memory holes are etched in the stack and films are deposited in the holes such that memory cells or select gate transistors are formed where the conductive layers intersect with the memory holes. The films include a charge-trapping layer which extends vertically along an individual cell or an entire NAND string, a tunneling layer and a channel layer. Some of the conductive layers are used as control gates for memory cells and other conductive layers are used as control gates for select gate transistors, such as drain or source-side transistors in NAND strings.

The memory device may be organized into blocks of memory cells in order to facilitate management. A block may contain a large number of NAND strings, as well as a number of word lines. The word lines connect control gates of memory cells on the NAND strings. In some techniques, all of the memory cells in the block are erased together. Then, the memory cells are programmed.

Programming the memory cells may include applying a program voltage to control gates of the memory cells, followed by testing a threshold voltage of the respective memory cells. Memory cells that have reached their respective target threshold voltage are locked out from further programming. Then, the magnitude of the program voltage is increased and again applied to the control gates. Once again, the threshold voltages of the memory cells are tested, with memory cells that have reached their respective target threshold voltage being locked out from further programming.

The memory cells may be programmed to a single bit per memory cell (SLC), two bits per memory cell (MLC), three bits per memory cell (TLC), four bits per memory cell (QLC), five bits per memory cell (PLC), or possible some other number of bits per memory cell.

However, various challenges remain in managing such memory devices. Memory devices have limited lifespans due to wear of the memory cells. Sometimes a block of memory cells is retired from use due to wear of the memory cells. In some techniques, a count is maintained of the number of times the block has been erased and programmed. If the program/erase count exceeds a threshold, then the block may be retired from use.

BRIEF DESCRIPTION OF THE DRAWING

Like-numbered elements refer to common components in the different figures.

FIG. 1B is a block diagram of one embodiment of a Front-End Processor Circuit.

FIG. 7 is a perspective view of an example embodiment of a monolithic three-dimensional (3D) memory structure.

DETAILED DESCRIPTION

Figure 1A:
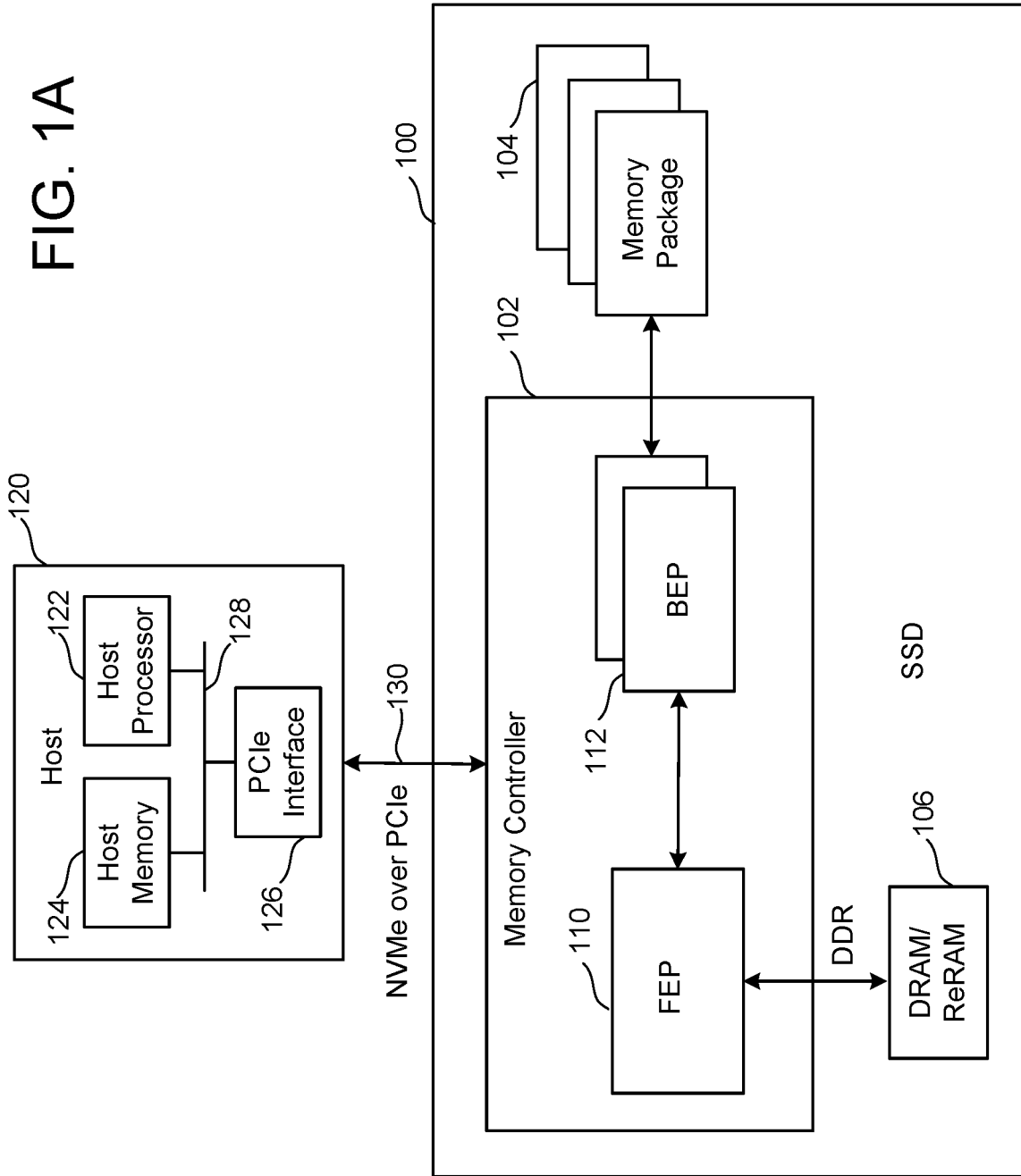
FIG. 1A is a block diagram of one embodiment of a storage system connected to a host.

The technology described herein pertains to operating a non-volatile storage system. The storage system may comprise a three-dimensional (3D) memory structure, which has NAND strings. In an embodiment, the storage system extends the useful life of a block of memory cells by changing an operating parameter in a physical region of the block that is more susceptible to wear than other regions. In one embodiment, an operating parameter in the physical region that is more susceptible to wear is changed in response to a program/erase count hitting a threshold. In one embodiment, an operating parameter in the physical region that is more susceptible to wear is changed in response to the storage system detecting a condition based on reading threshold voltages of the memory cells.

In one embodiment, the system programs a block of memory cells using a first programming technique when a program/erase count is below a threshold. After the program/erase count is above the threshold, the system programs a first pre-determined region of the block with a second programming technique. However, the system continues to program a second pre-determined region of the block with the first programming technique after the program/erase count is above the threshold. In an embodiment, the first pre-determined region is more susceptible to degradation than the second pre-determined region. Moreover, the second programming technique may be designed to compensate for the degradation of the first pre-determined region. Hence, the overall life of the block can be extended by changing to the second programming technique for the region that is more susceptible to degradation.

In one embodiment, the first pre-determined region is a sub-block that contains a first set of NAND strings, and the second pre-determined region is a sub-block that contains a second set of NAND strings. In an embodiment, the first sub-block is an outer sub-block, and the second sub-block is an inner sub-block. The outer sub-block may be more susceptible to degradation than the inner sub-block. In one embodiment, the first pre-determined region contains memory cells connected to a first set of word lines, and the second pre-determined region contains memory cells connected to a second set of word lines. The memory cells connected to the first set of word lines may be more susceptible to degradation than the memory cells connected to the second set of word lines. A possible factor in the rate of degradation of the memory cells is the semiconductor fabrication techniques. For example, the semiconductor fabrication techniques may result in memory cells in different regions having a different thickness of a layer of material in the memory cell. The wear rate may depend on the thickness of this layer of material.

In one embodiment, the first programming technique includes a first program voltage step size, and the second programming technique includes a second program voltage step size that is smaller than the first program voltage step size. Using the smaller (second) program voltage step size in the region of the block that is more susceptible to degradation extends the useful life of that region. Therefore, the overall life of the block is extended.

In one embodiment, the first programming technique includes programming the memory cells to n bits per cell, and the second programming technique includes programming the memory cells to m bits per cell, where m is less than n. This transition could be MLC to SLC, TLC to MLC, TLC to SLC, QLC to TLC, QLC to MLC, QLC to SLC, etc. Programming memory cells to fewer bits per cell in the region of the block that is more susceptible to degradation extends the useful life of that region. Therefore, the overall life of the block is extended.

The foregoing are a few non-exhaustive examples. Other examples are described herein.

FIG. 1A-FIG. 9B describe one example of a storage system that can be used to implement the technology disclosed herein.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid-state drive ("SSD"); however, other types of storage systems can also be used. Storage system 100 comprises a memory controller 102, memory package 104 for storing data, and local memory (e.g. DRAM/ReRAM) 106. Memory controller 102 comprises a Front-End Processor Circuit (FEP) 110 and one or more Back-End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two-dimensional NAND flash memory and/or three-dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory, or another type of storage. Host system 120 is external to and separate from storage system 100. In one embodiment, storage system 100 is embedded in host system 120.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
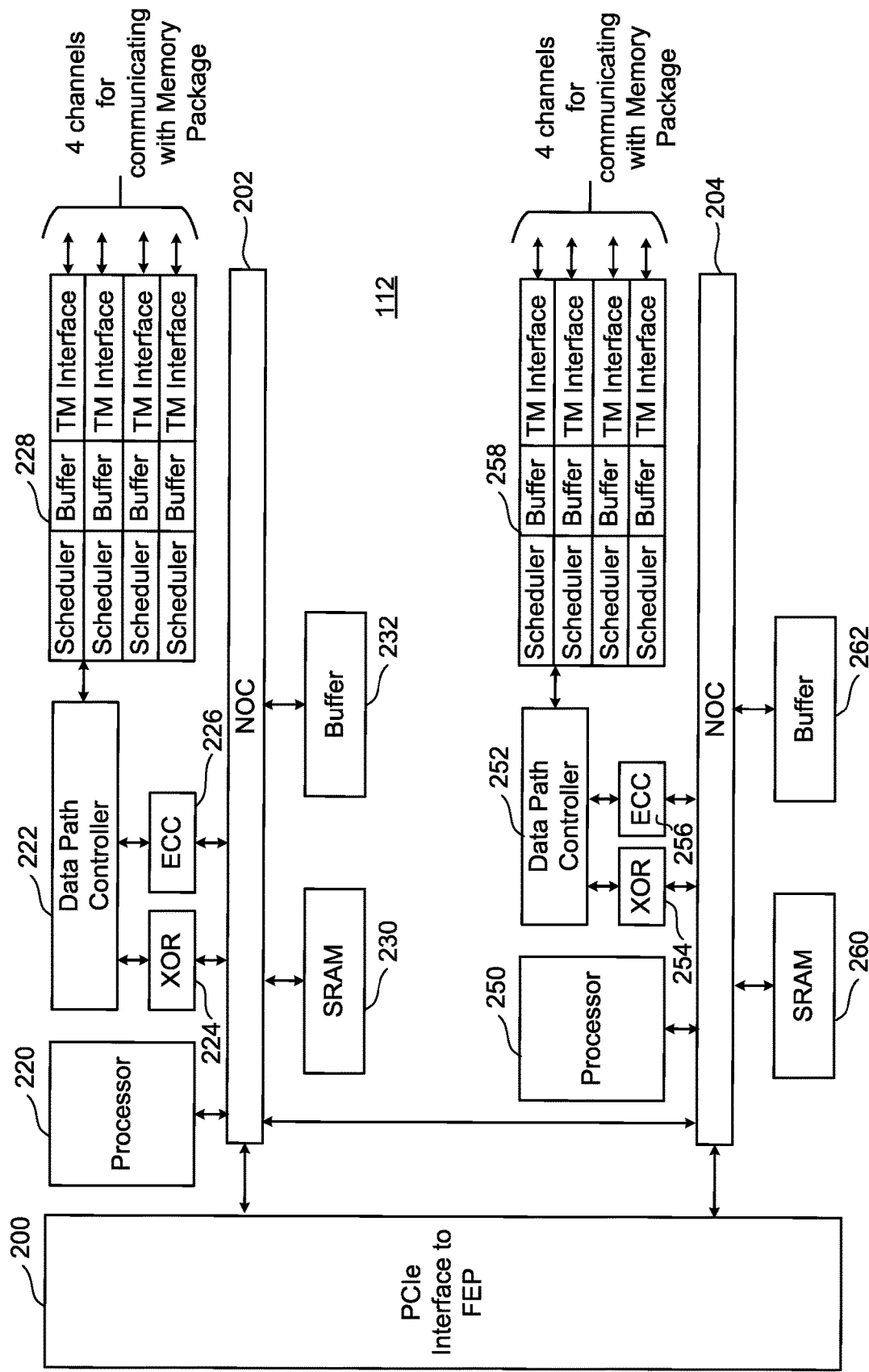
FIG. 2A is a block diagram of one embodiment of a Back-End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. The XOR engines 224/254 are used to XOR the data so that data can be combined and stored in a manner that can be recovered in case there is a programming error. In an embodiment, the XOR engines 224/254 can recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
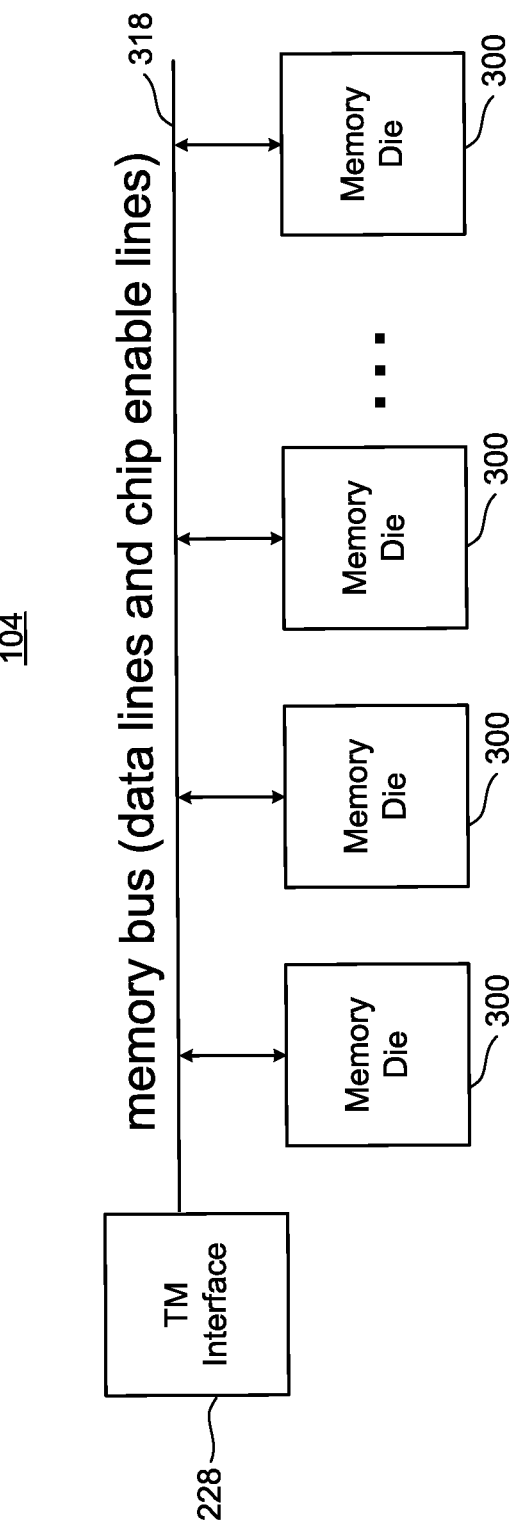
FIG. 2B is a block diagram of one embodiment of a memory package.

FIG. 2B is a block diagram of one embodiment of a memory package 104 that includes a plurality of memory dies 300 connected to a memory bus (data lines and chip enable lines) 318. The memory bus 318 connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or 16 memory dies; however, other numbers of memory dies can also be implemented. The technology described herein is not limited to any particular number of memory dies. In some embodiments, the memory package can also include a processor, CPU device, such as a RISC-V CPU along with some amount of RAM to help implement some of capabilities described below. The technology described herein is not limited to any particular number of memory dies.

Figure 3A:
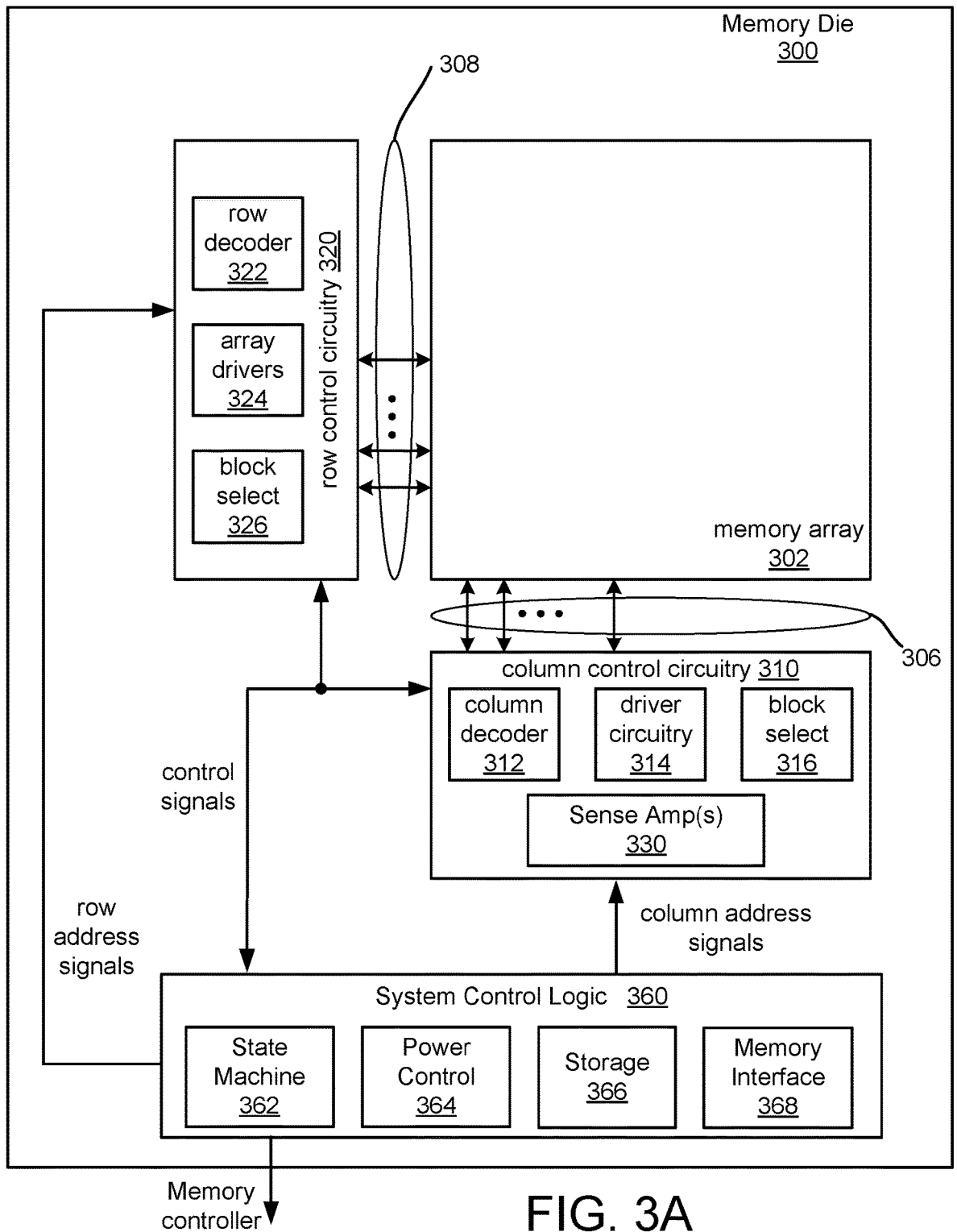
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. Although only single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from the memory controller and provides output data and status to the memory controller. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory structure 302 during memory operations and may include charge pumps and regulator circuit for creating regulating voltages. System control logic 360 includes storage 366, which may be used to store parameters for operating the memory array 302.

Commands and data are transferred between the memory controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the memory controller 102.

In some embodiments, all the elements of memory die 300, including the system control logic 360, can be formed as part of a single die. In other embodiments, some or all of the system control logic 360 can be formed on a different die.

In one embodiment, memory structure 302 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of storage system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the storage system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. The memory die may contain other elements such as word lines, bit lines, and select transistors. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
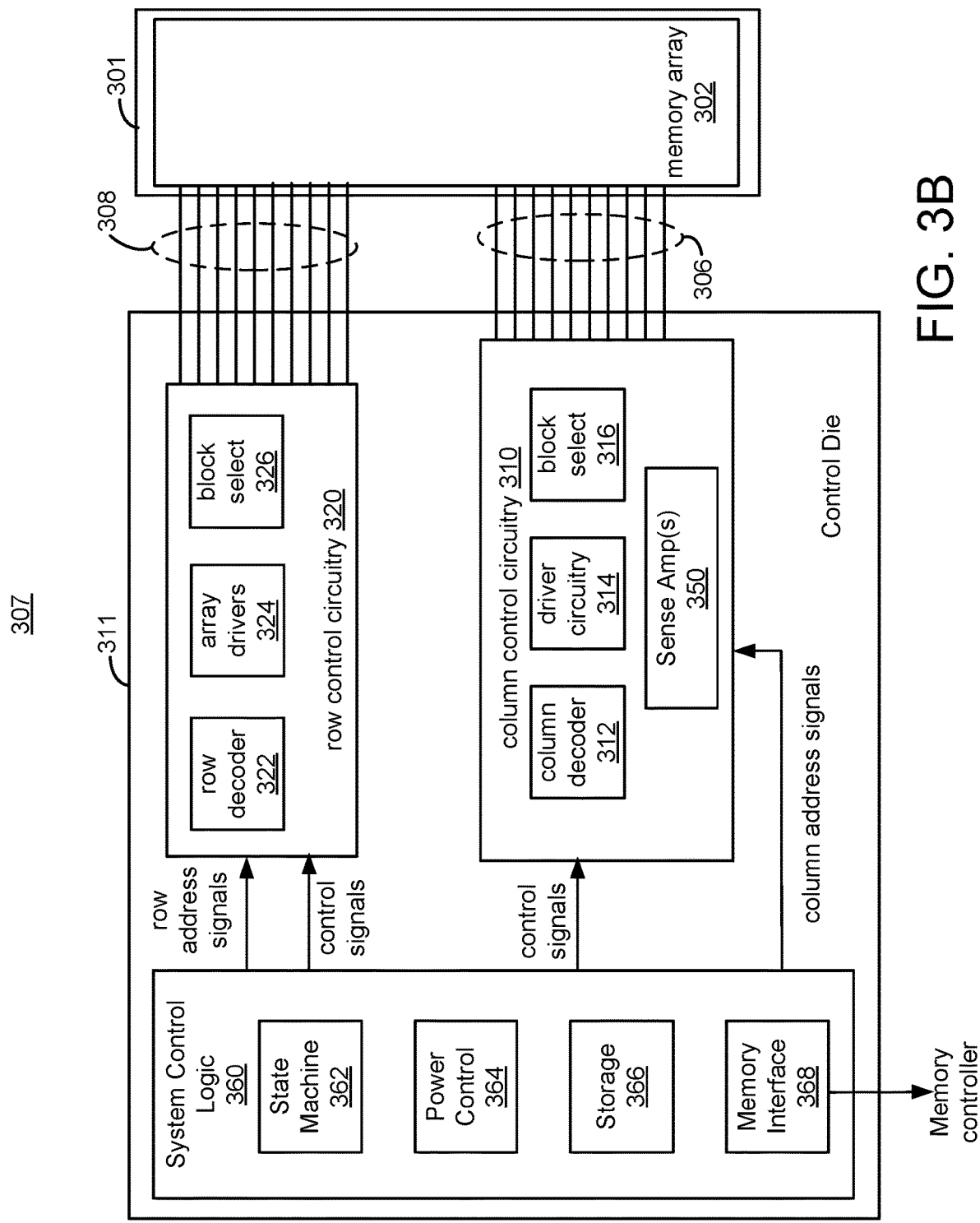
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. System control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "a control circuit" can include one or more of memory controller 102, system control logic 360, column control circuitry 310, row control circuitry 320, a micro-controller, a state machine, micro-processor, and/or other control circuitry, or other analogous circuits that are used to control non-volatile memory. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

Figure 4A:
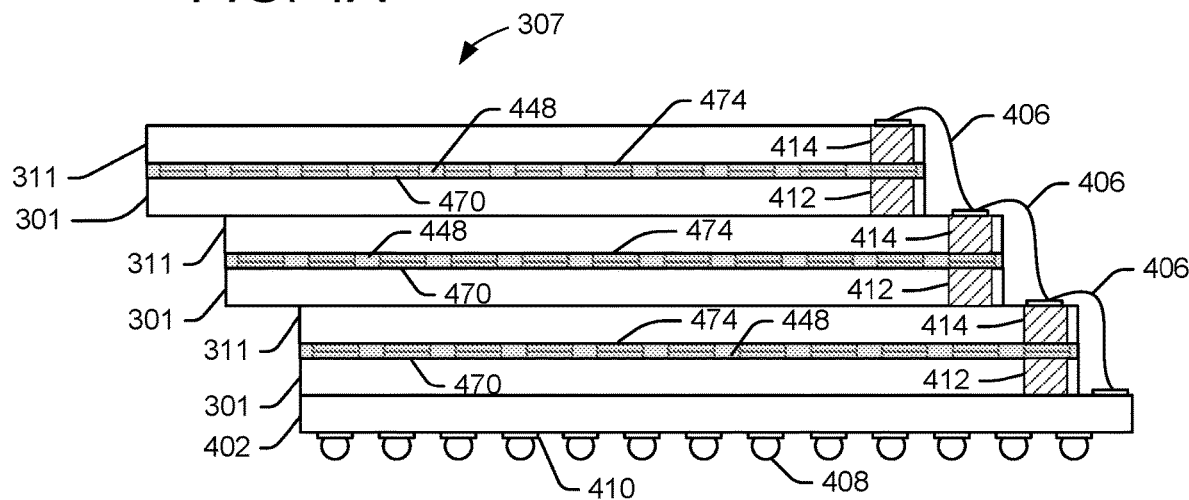
FIG. 4A depicts a side view of an embodiment of an integrated memory assembly stacked on a substrate.

In some embodiments, there is more than one control die 311 and more than one memory structure die 301 in an integrated memory assembly 307. In some embodiments, the integrated memory assembly 307 includes a stack of multiple control dies 311 and multiple memory structure dies 301. FIG. 4A depicts a side view of an embodiment of an integrated memory assembly 307 stacked on a substrate 402 (e.g., a stack comprising control dies 311 and memory structure dies 301). The integrated memory assembly 307 has three control dies 311 and three memory structure dies 301. In some embodiments, there are more than three memory structure dies 301 and more than three control die 311.

Each control die 311 is affixed (e.g., bonded) to at least one of the memory structure dies 301. Some of the bond pads 470, 474, are depicted. There may be many more bond pads. A space between two dies 301, 311 that are bonded together is filled with a solid layer 448, which may be formed from epoxy or other resin or polymer. This solid layer 448 protects the electrical connections between the dies 301, 311, and further secures the dies together. Various materials may be used as solid layer 448, but in embodiments, it may be Hysol epoxy resin from Henkel Corp., having offices in California, USA.

The integrated memory assembly 307 may for example be stacked with a stepped offset, leaving the bond pads at each level uncovered and accessible from above. Wire bonds 406 connected to the bond pads connect the control die 311 to the substrate 402. A number of such wire bonds may be formed across the width of each control die 311 (i.e., into the page of FIG. 4A).

A memory structure die through silicon via (TSV) 412 may be used to route signals through a memory structure die 301. A control die through silicon via (TSV) 414 may be used to route signals through a control die 311. The TSVs 412, 414 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 408 may optionally be affixed to contact pads 410 on a lower surface of substrate 402. The solder balls 408 may be used to couple the integrated memory assembly 307 electrically and mechanically to a host device such as a printed circuit board. Solder balls 408 may be omitted where the integrated memory assembly 307 is to be used as an LGA package. The solder balls 408 may form a part of the interface between the integrated memory assembly 307 and the memory controller 102.

Figure 4B:
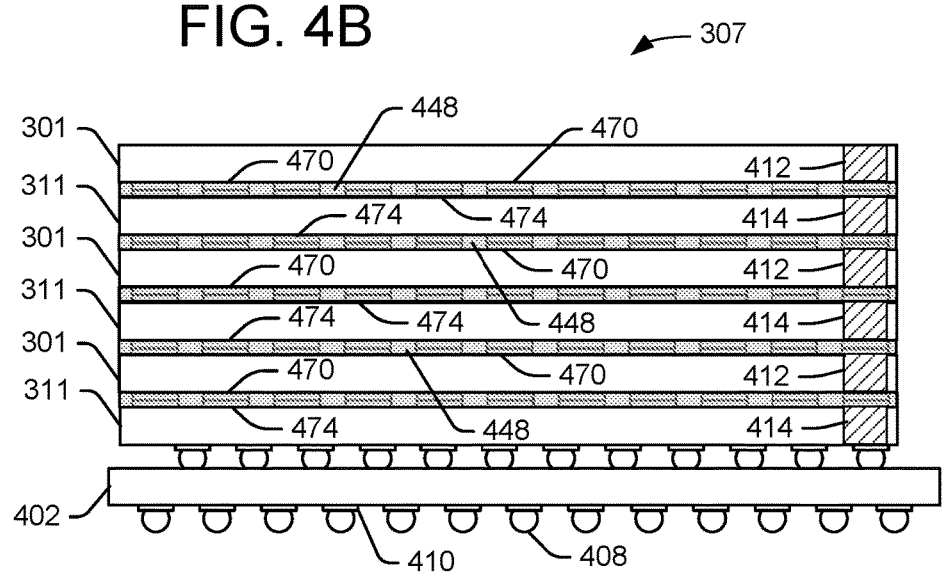
FIG. 4B depicts a side view of an embodiment of an integrated memory assembly stacked on a substrate.

FIG. 4B depicts a side view of an embodiment of an integrated memory assembly 307 stacked on a substrate 402. The integrated memory assembly 307 has three control die 311 and three memory structure die 301. In some embodiments, there are many more than three memory structure dies 301 and many more than three control dies 311. In this example, each control die 311 is bonded to at least one memory structure die 301. Optionally, a control die 311 may be bonded to two memory structure dies 301.

Some of the bond pads 470, 474 are depicted. There may be many more bond pads. A space between two dies 301, 311 that are bonded together is filled with a solid layer 448, which may be formed from epoxy or other resin or polymer. In contrast to the example in FIG. 4A, the integrated memory assembly 307 in FIG. 4B does not have a stepped offset. A memory structure die through silicon via (TSV) 412 may be used to route signals through a memory structure die 301. A control die through silicon via (TSV) 414 may be used to route signals through a control die 311.

Solder balls 408 may optionally be affixed to contact pads 410 on a lower surface of substrate 402. The solder balls 408 may be used to couple the integrated memory assembly 307 electrically and mechanically to a host device such as a printed circuit board. Solder balls 408 may be omitted where the integrated memory assembly 307 is to be used as an LGA package.

As has been briefly discussed above, the control die 311 and the memory structure die 301 may be bonded together. Bond pads on each die 301, 311 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 301, 311. Where no such film is initially provided, a space between the dies may be under filled with an epoxy or other resin or polymer. The under-fill material may be applied as a liquid which then hardens into a solid layer. This under-fill step protects the electrical connections between the dies 301, 311, and further secures the dies together. Various materials may be used as under-fill material.

Figure 5:
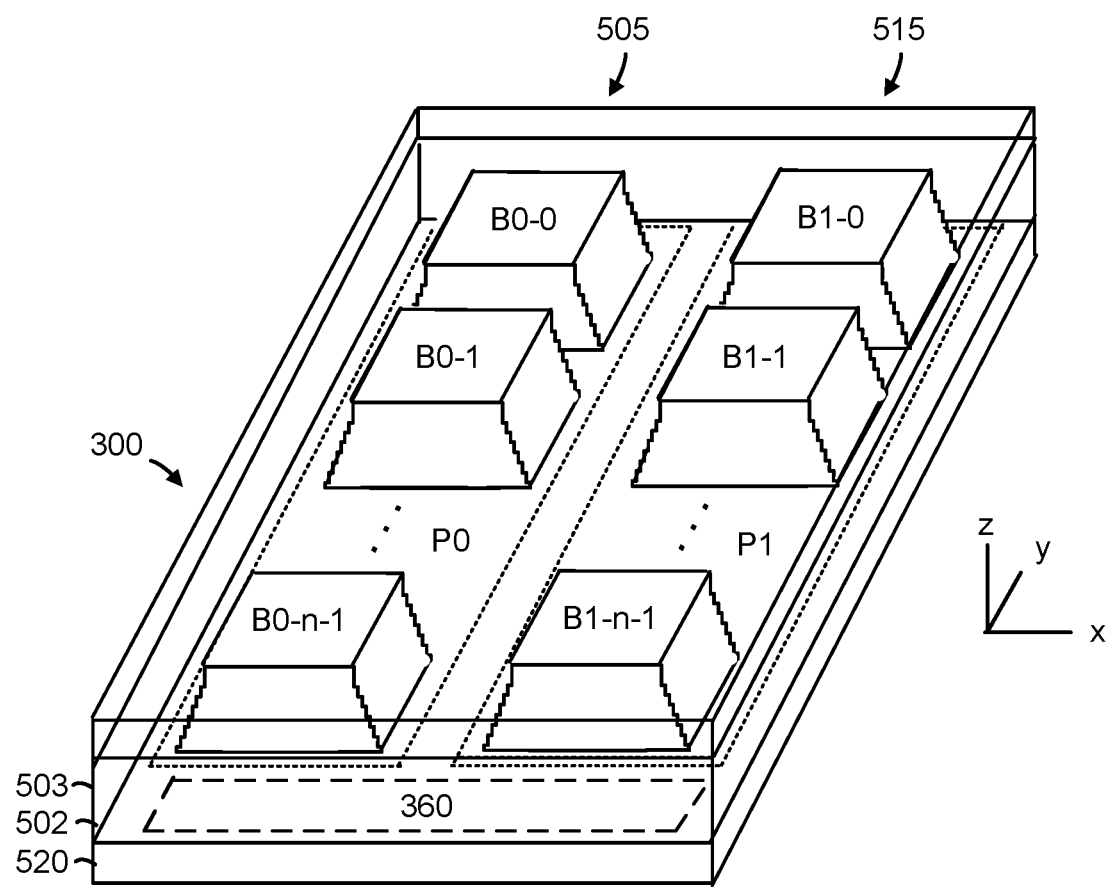
FIG. 5 is a perspective view of an example memory die in which blocks are provided in respective planes P0 and P1.

FIG. 5 is a perspective view of an example of memory die 300 in which blocks are provided in respective planes P0 and P1. Note that the device in FIG. 5 may also be used for the memory structure die 301. The memory die includes a substrate 520, an intermediate region 502 in which blocks of NAND strings are formed, and an upper region 503 in which one or more upper metal layers are patterned such as to form bit lines. Planes P0 and P1 represent respective isolation regions which are formed in the substrate 520. Further, a first block sequence 505 of a number n blocks, labelled B0-0 to B0-$n$-1, are formed in P0, and a second block sequence 515 of a number n blocks, labelled B1-0 to B1-$n$-1, are formed in P1. Each plane may have associated row and column control circuitry, such as the row control circuitry 320 and column control circuitry 310 of FIG. 3A.

The system control logic 360, which may reside in a peripheral area, may be shared among the planes, in one approach. Each plane may have a separate set of bit lines. In some embodiments, the system control logic 360 is located on a different die than the memory die 300.

By providing blocks of memory cells in multiple planes, parallel operations can be performed in the planes. For example, blocks in different planes can be erased concurrently. Also, pages of memory cells in different planes can be programmed or read concurrently.

The substrate 520 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

While the above example is directed to a 3D memory device with vertically extending NAND strings, in some embodiments, the techniques provided herein are also applicable to a 2D memory device in which the NAND strings extend horizontally on a substrate.

Figure 6:
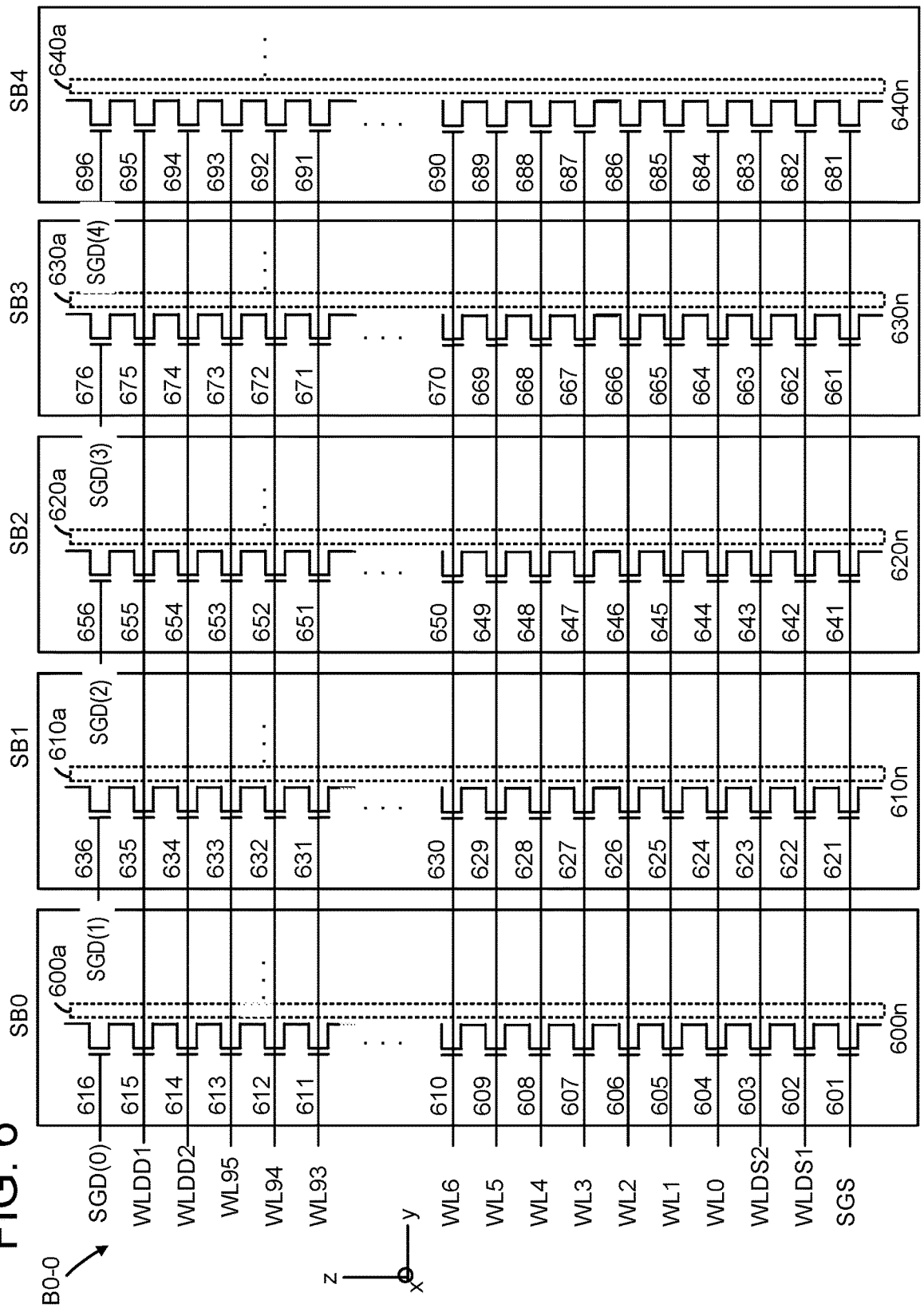
FIG. 6 depicts an example view of sub-blocks of NAND strings in a block.

FIG. 6 depicts an example view of NAND strings in the block B0-0. The NAND strings are arranged in sub-blocks (e.g., SB0, SB1, SB2, SB3, SB4) of the block in a 3D configuration. Each sub-block includes a set of NAND strings, where one example NAND string is depicted. For example, SB0, SB1, SB2, SB3, and SB4 comprise example NAND strings 600n, 610n, 620n, 630n, and 640n respectively. As the term is used herein, a block contains NAND strings that are connected to the same set of word lines. As the term is used herein, a sub-block is a portion of a block that contains a subset of NAND strings that are independently selectable for program and read operations. Typically, only one of the sub-blocks in a block is selected for program or read at one point in time. In an embodiment, a sub-block has its own drain side select line in order to independently select the NAND strings. For example, SB0 is selected by SGD(0), SB1 is selected by SGD(1), SB2 is selected by SGD(2), SB3 is selected by SGD(3), and SB4 is selected by SGD(4). A drain side select line (SGD) is used to connect/disconnect the NAND strings of a sub-block to/from bit lines. In an embodiment, the different sub-blocks of a block share a set of bit lines.

The NAND strings are associated with data word lines, dummy word lines and select gate lines. Each sub-block comprises a set of NAND strings. An individual NAND string extends in the z direction. There are many NAND strings in each sub-block, with a set of NAND strings having a common SGD line extending in the x direction. The NAND strings 600n, 610n, 620n, 630n, and 640n are in sub-blocks SB0, SB1, SB2, SB3, and SB4, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2, SB3, and then SB4, then programming WL1 in SB0, SB1, SB2, SB3, and then SB4, and so forth. The word line programming order may start at WL0, the source end word line and end at WL95, the drain end word line, for example. In an erase operation, typically the entire block is erased, although a partial block erase is also possible.

The plurality of memory cells of B0-0 are arranged in NAND strings, where each NAND string comprises a continuous charge trapping layer along a length of the NAND string. The NAND strings 600n, 610n, 620n, 630n, and 640n have channels 600a, 610a, 620a, 630a and 640a, respectively. Additionally, NAND string 600n includes SGS transistor 601, source-side dummy memory cells 602 and 603, data memory cells 604-613, drain-side dummy memory cells 614 and 615 and SGD transistor 616. NAND string 610n includes SGS transistor 621, source-side dummy memory cells 622 and 623, data memory cells 624-633, drain-side dummy memory cells 634 and 635 and SGD transistor 636. NAND string 620n includes SGS transistor 641, source-side dummy memory cells 642 and 643, data memory cells 644-653, drain-side dummy memory cells 654 and 655 and SGD transistor 656. NAND string 630n includes SGS transistor 661, source-side dummy memory cells 662 and 663, data memory cells 664-673, drain-side dummy memory cell 674 and 675 and SGD transistor 676. NAND string 640n includes SGS transistor 681, source-side dummy memory cells 682 and 683, data memory cells 684-693, drain-side dummy memory cell 694 and 695 and SGD transistor 696.

This example depicts one SGD transistor at the drain end of each NAND string, and one SGS transistor at the source end of each NAND string, but multiple SGS and/or SGD transistors could be provided in each NAND string. In one approach, multiple SGD transistors in a NAND string have their control gates connected so that that are driven by a common voltage signal. Multiple SGS transistors in a NAND string can similarly have their control gates connected. The SGD transistors in SB0, SB1, SB2, SB3, and SB4 are driven by separate control lines SGD(0), SGD(1), SGD(2), SGD(3) and SGD(4), respectively, in one embodiment. The SGS transistors in are driven by one control line SGS.

FIG. 7 is a perspective view of one example embodiment of a monolithic three-dimensional (3D) memory structure 700, which may form a portion of memory structure 302. The 3D memory structure 700 includes a plurality non-volatile memory cells arranged as NAND strings. For example, FIG. 7 shows a portion of one block. The 3D memory structure 700 of FIG. 7 shows a portion of two sub-blocks. For example, the 3D memory structure 700 may correspond to a portion of SB0 and SB1. The 3D memory structure 700 will extend in the y direction; therefore, the entire sub-blocks are not depicted in FIG. 7. The 3D memory structure 700 may also extend in the x direction; therefore, the block may have additional sub-blocks.

The 3D memory structure 700 includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The conductive layers may be referred to herein as horizontal conductive layers, as they are horizontal with respect to the substrate. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 4 select layers, 2 dummy word line layers and 104 dielectric layers. More or fewer than 108-304 layers can also be used.

A local interconnect LI is depicted on one side of the 3D memory structure 700. An SGD etch structure 702 divides the SGD into SGD(0) and SGD(1). SGD(0) is in SB0 and SGD(1) is in SB1. The SGD etch structure 702 is an insulator, such as silicon oxide.

The lowermost conductive layer is an SGS layer. Below the alternating dielectric layers and word line layers is the substrate 540, which may contain a source line (SL). Vertical columns of materials (also known as memory holes (MH)) are formed in the stack of alternating dielectric layers and conductive layers. For example, one of the vertical columns/memory holes is marked as MH. Note that in FIG. 7, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 8A:
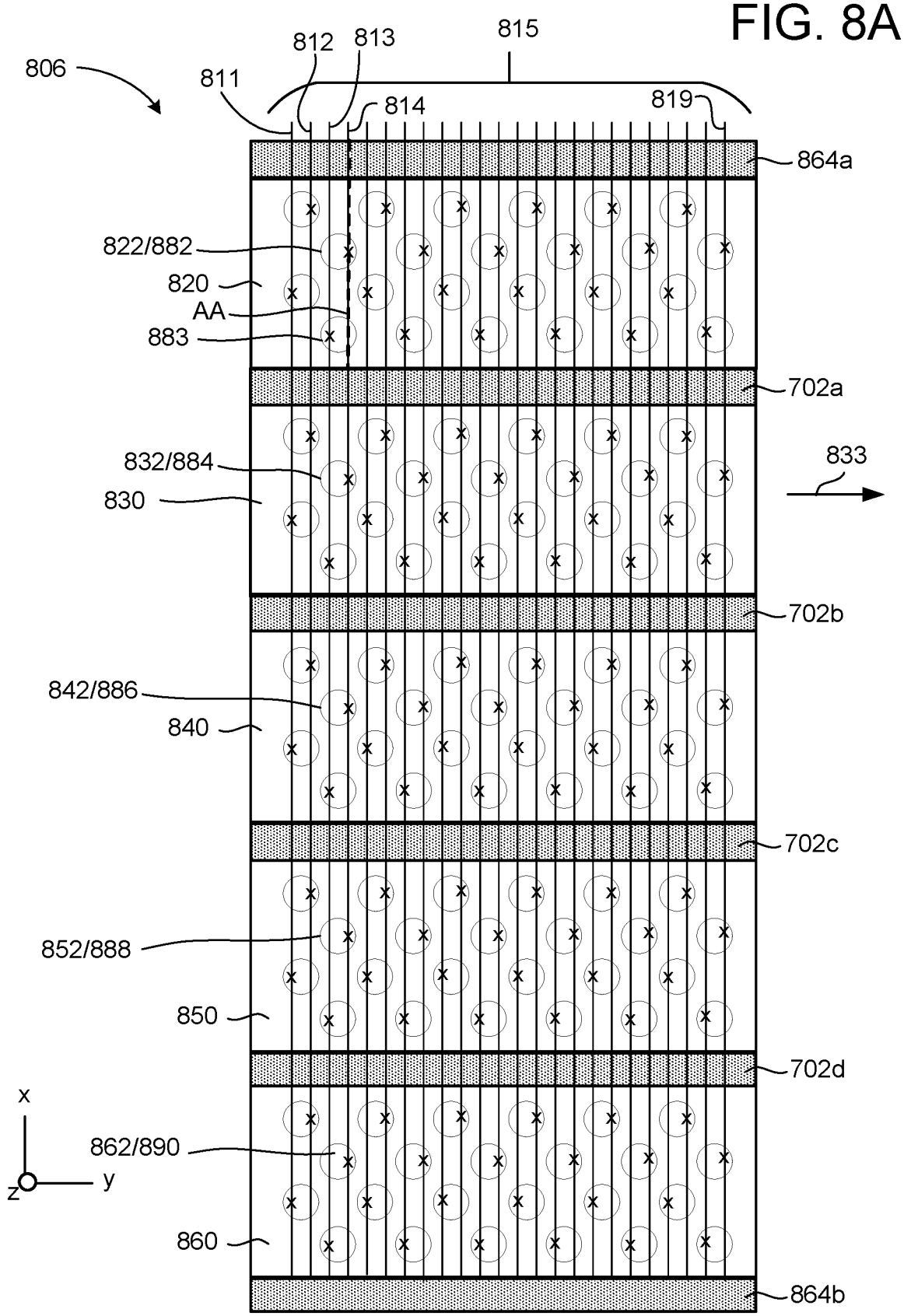
FIG. 8A depicts a top view of a top level of portion of a block of memory cells.

FIG. 8A depicts a view of a portion of a top layer 806 of the 3D memory structure to provide further details of how a block may be divided into sub-blocks. FIG. 8A is a diagram depicting a top view of a portion of one block from memory structure 302. The portion of the block depicted in FIG. 8A contains five sub-blocks, as in the example of FIG. 6. As can be seen from FIG. 8A, the block extends in the direction of arrow 833. FIG. 8A only shows the top layer (e.g., SGD layer).

FIG. 8A depicts a plurality of circles that represent the vertical columns (or memory holes). Each of the vertical columns include multiple select transistors and multiple memory cells. In one embodiment, each vertical column implements a NAND string. For example, FIG. 8A depicts vertical columns 822, 832, 842, 852, and 862. Vertical column 822 implements NAND string 882. Vertical column 832 implements NAND string 884. Vertical column 842 implements NAND string 886. Vertical column 852 implements NAND string 888. Vertical column 862 implements NAND string 890. More details of the vertical columns are provided below. Since the block depicted in FIG. 8A extends in the direction of arrow 833, the block includes more vertical columns than depicted in FIG. 8A.

FIG. 8A also depicts a set of bit lines 815, including bit lines 811, 812, 813, 814, . . . 819. FIG. 8A shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 814 is connected to vertical columns 822, 832, 842, 852, and 862.

The block depicted in FIG. 8A includes a set of local interconnects (LI) 864a, 864b, which connect to the substrate 520 below the vertical columns. The block depicted in FIG. 8A includes four SGD etch structures 702a, 702b, 702c, 702d. FIG. 7 depicts how the LI connects down to the substrate 520, and how an SGD etch structure 702 divides the SGD layer into two regions (e.g., SGD(0) and SGD(1)). Hence, LIs 864a, 864b form the outer edges of the block. The SGD etch structures 702a, 702b, 702c, 702d divide the SGD layer of the block into five regions. For example, the layer depicted in FIG. 8A is divided into regions 820, 830, 840, 850, and 860, which are referred to as sub-blocks (e.g., SB0, SB1, SB2, SB3, and SB4). The sub-blocks in regions 820 and 860 are referred to herein as "outer sub-blocks. The sub-blocks in regions 830, 840, and 850 are referred to herein as "inner sub-blocks." In general, the sub-blocks are much longer in the y-direction than in the x-direction. The outer sub-blocks are those that are at the outer edge of the block along this longer edge. In inner sub-block is not at the edge of the block on this longer edge. One or more inner sub-blocks reside between two outer sub-blocks. Note that it is possible for an inner sub-block to be at the outer edge of the block on the shorter edge of the block.

The wear rate of the outer sub-blocks may differ from the wear rate of the inner sub-blocks. In the lower layers of the block that implement memory cells, it is not required for the SGD etch structures 702 to be present (see, FIG. 7). However, optionally, the SGD etch structures 702 could extend down to the substrate 520. By providing five separate SGD lines, the block can be operated as five sub-blocks. In some embodiments, the word line regions at a given level connect together at the end of the block to form a single word line.

In one example implementation, a bit line only connects to one vertical column in each of regions 820, 830, 840, 850, and 860. In that implementation, each block has 20 rows of active columns and each bit line connects to five NAND strings in each block. In one embodiment, all of five NAND strings connected to a common bit line are connected to the same word line (via different word line sub-blocks on the same level that are connected together); therefore, the system uses the drain side select lines to choose one (or another subset) of the five to be subjected to a memory operation (program, verify, read, and/or erase).

Although FIG. 8A shows each region having four rows of vertical columns, five regions and 20 rows of vertical columns in a block, those exact numbers are an example implementation. Other embodiments may include more or fewer regions per block, more or fewer rows of vertical columns per region and more or fewer rows of vertical columns per block.

FIG. 8A also shows the vertical columns being staggered. In other embodiments, different patterns of staggering can be used. In some embodiments, the vertical columns are not staggered.

Figure 8B:
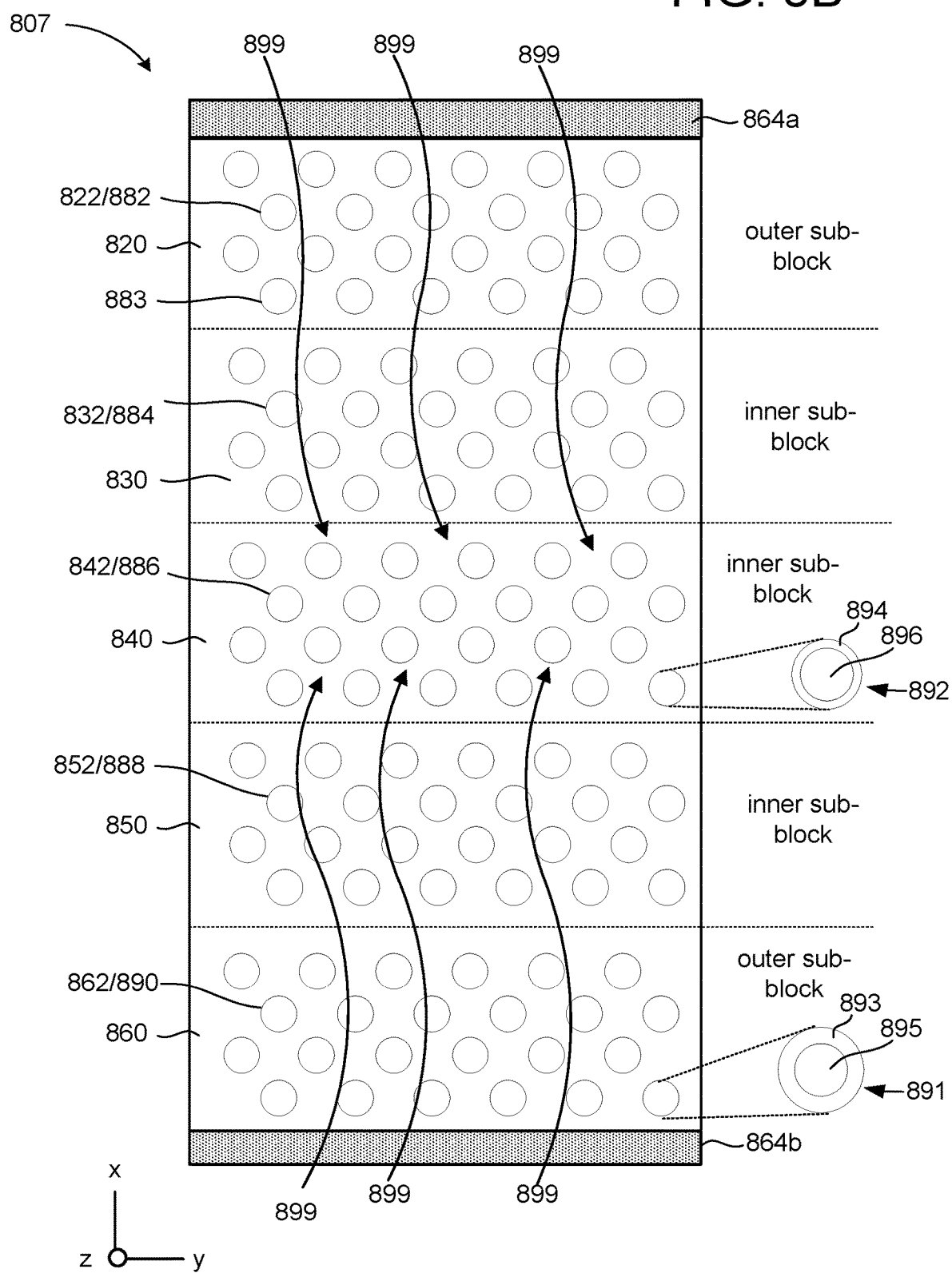
FIG. 8B depicts a view of a portion of a word line layer of the 3D memory structure.

FIG. 8B depicts a view of a portion of a word line layer 807 of the 3D memory structure. The portion of the block depicted in FIG. 8B corresponds to the portion depicted in FIG. 8A, but is at a word line layer. Thus, FIG. 8B shows regions 820, 830, 840, 850, and 860, which are each a portion of one of the five sub-blocks. The sub-blocks are labeled as either an outer sub-block or an inner sub-block. Outer sub-block in region 820 is bounded by local interconnect 864a. Outer sub-block in region 860 is bounded by local interconnect 864b. The SGD etch structures 702 that are depicted in FIG. 8 do not extend to the word line layer in FIG. 8B. Hence, regions 820, 830, 840, 850, 860 form one contiguous electrically conductive plate at the depicted word line layer. The dashed lines depicted between the regions 820, 830, 840, 850, 860 are shown to indicate the boundaries of the sub-blocks. The vertical columns 822, 832, 842, 852, and 862 depicted in FIG. 8B are continuations of the vertical columns 822, 832, 842, 852, and 862 depicted in FIG. 8A. The NAND strings 882, 883, 884, 886, 888, and 890 depicted in FIG. 8B are continuations of the NAND strings 882, 883, 884, 886, 888, and 890 depicted in FIG. 8A.

In some embodiments, the process of manufacturing the 3D memory structure includes depositing alternating layers of silicon oxide and silicon nitride. The silicon oxide will serve as the dielectric layers. The silicon nitride is a sacrificial material that will eventually be replaced with tungsten (or another conductor) to serve as the word line layers. Prior to removing the silicon nitride, holes for the vertical columns 822, 832, 842, 852, and 862 are drilled into the alternating layers of silicon oxide and silicon nitride. The holes may be filled with films to form the NAND strings 882, 883, 884, 886, 888, and 890. Further details of the films are discussed in connection with FIG. 9A. As noted above, the sacrificial silicon nitride layers are removed by an etchant. This leaves portions of the vertical columns 822, 832, 842, 852, and 862 exposed where the silicon nitride was removed. Then, a block oxide such as aluminum oxide is deposited onto the outer surfaces of the vertical columns 822, 832, 842, 852, and 862. In one embodiment, the local interconnects 864a, 864b are open trenches at this time such that the aluminum oxide can be deposited by way of those trenches. Arrows 899 in FIG. 8B show the general direction in which the aluminum oxide is deposited. It is possible that the aluminum oxide will be thicker in the outer sub-blocks than in the inner sub-blocks. A cross section of two of the vertical columns are depicted in FIG. 8B to illustrate this difference in thickness. A cross-section of vertical column 891 is depicted in an outer sub-block. A cross-section of vertical column 892 is depicted in an inner sub-block. Vertical column 891 has a blocking layer (e.g., aluminum oxide) 893 and films 895 that were formed in the holes drilled into the alternating layers of silicon oxide and silicon nitride. Vertical column 892 has a blocking layer (e.g., aluminum oxide) 894 and films 896. The blocking layer 893 in the outer sub-block is shown as being substantially thicker than the blocking layer 894 in the inner sub-block. This difference in thickness can have a substantial impact on the wear rate of memory cells in the respective sub-blocks.

Figure 9A:
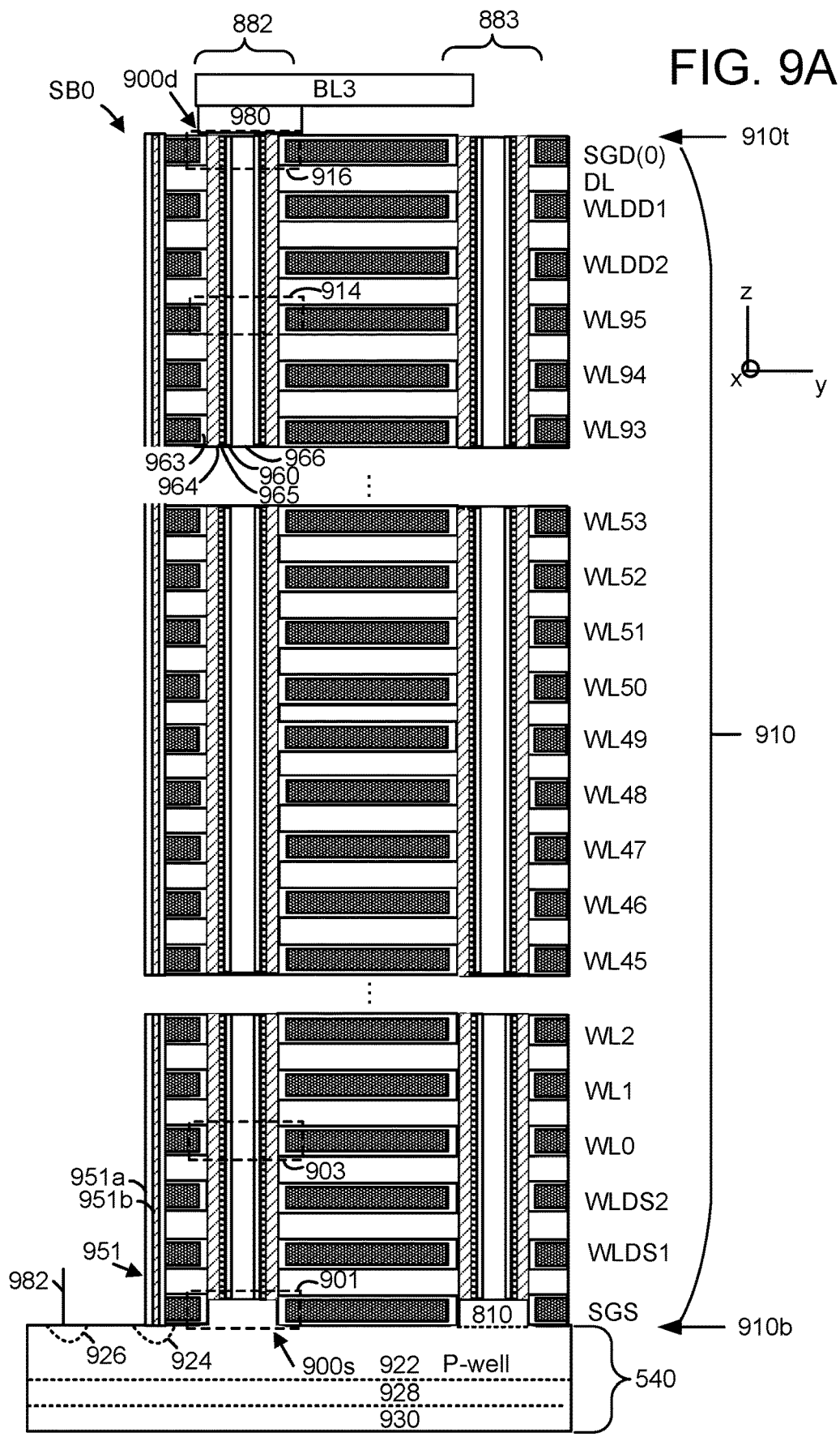
FIGS. 9A-9B depict cross-sectional views of a portion of a sub-block, each depicting two NAND strings above a substrate.

FIG. 9A depicts an example cross-sectional view of a portion of a sub-block, including NAND strings 882 and 883, in a single-tier stack. FIG. 9A depicts a cross-sectional view along line AA in FIG. 8A. In this example, the NAND strings 882 and 883 are in the same sub-block (e.g., SB0). NAND string 882 is connected to BL3 (referred to as 814 in FIG. 8A). The bit line to which NAND string 883 is connected (813 in FIG. 8A) is not depicted in FIG. 9A.

The sub-block comprises a stack 910 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A memory controller considers the data memory cells to be eligible to store user data. In this example, the stack includes ninety-six data word lines, WL0-WL95. The data word lines are separated by dielectric layers. DL is an example dielectric layer.

The conductive layers connected to control gates of dummy memory cells are referred to as dummy word lines. Dummy memory cells can have the same construction as data memory cells but are considered by the memory controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to the interface, above and below the interface. For example, see FIG. 9B, and the upper and lower interface dummy word lines, WLIFDU and WLIFDL, respectively.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 910t and bottom 910b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, with select gate transistors formed in regions in which the SGS and SGD control lines intersect with the multiple thin layers. For example, a drain-side select gate transistor 916 is formed where the SGD control line intersects with the multiple thin layers, a source-side select gate transistor 901 is formed where the SGS control line intersects with the multiple thin layers, a topmost data memory cell 914 is formed where the WL95 word line intersects with the multiple thin layers, and a bottom most data memory cell 903 is formed where the WL0 word line intersects with the multiple thin layers.

The multiple thin layers can form annular layers and can be deposited, e.g., using atomic layer deposition. For example, the layers can include a charge-trapping layer 964 or film such as silicon nitride (Si3N4) or other nitride, a tunneling layer 965 (e.g., a gate oxide) and a channel 960 (e.g., comprising polysilicon). A dielectric core 966 (e.g., comprising silicon dioxide) can also be provided. A word line or control line can comprise a metal such as Tungsten. A blocking oxide layer 963 is provided between the word line and the charge-trapping layer 964. The multiple thin layers form a columnar active area (AA) of a NAND string.

The stack is formed on a substrate 540. In one approach, the substrate includes a p-well region 922 connected to the source ends of the NAND strings. The p-well region may comprise epitaxial regions 922 which extend upward adjacent to the source-side select gate transistors. The p-well region can include an n+ contact 924 connected to a local interconnect 951 for receiving a source line voltage, and a p+ contact 926 connected to a p-well contact 982 for receiving a p-well voltage. The local interconnect 951 can comprise a conductive material 951b such as metal surrounded by insulating material 951a to prevent conduction with the metal of the adjacent word lines. The p-well region is formed in an n-well 928, which in turn is formed in a p-type semiconductor region 930 of the substrate 540, in one possible implementation.

The NAND string 882 has a source end 900s at a bottom 910b of the stack 910, connected to the p-well. The NAND string 882 also has a drain end 900d at a top 910t of the stack, connected to a bit line BL3 via a bit line contact 980 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vt of a memory cell is increased in proportion to the amount of stored charge. During an erase operation, the channels of the NAND string are charged up, such as by applying a positive erase pulse to the substrate via the local interconnect 951, causing the electrons to return to the channel from the charge trapping layer.

In this example, the SGS transistors have a body 810, but do not include the multiple thin layers 960, 963, 964 and 965. As a result, there is a reduced likelihood of a Vt shift.

Figure 9B:
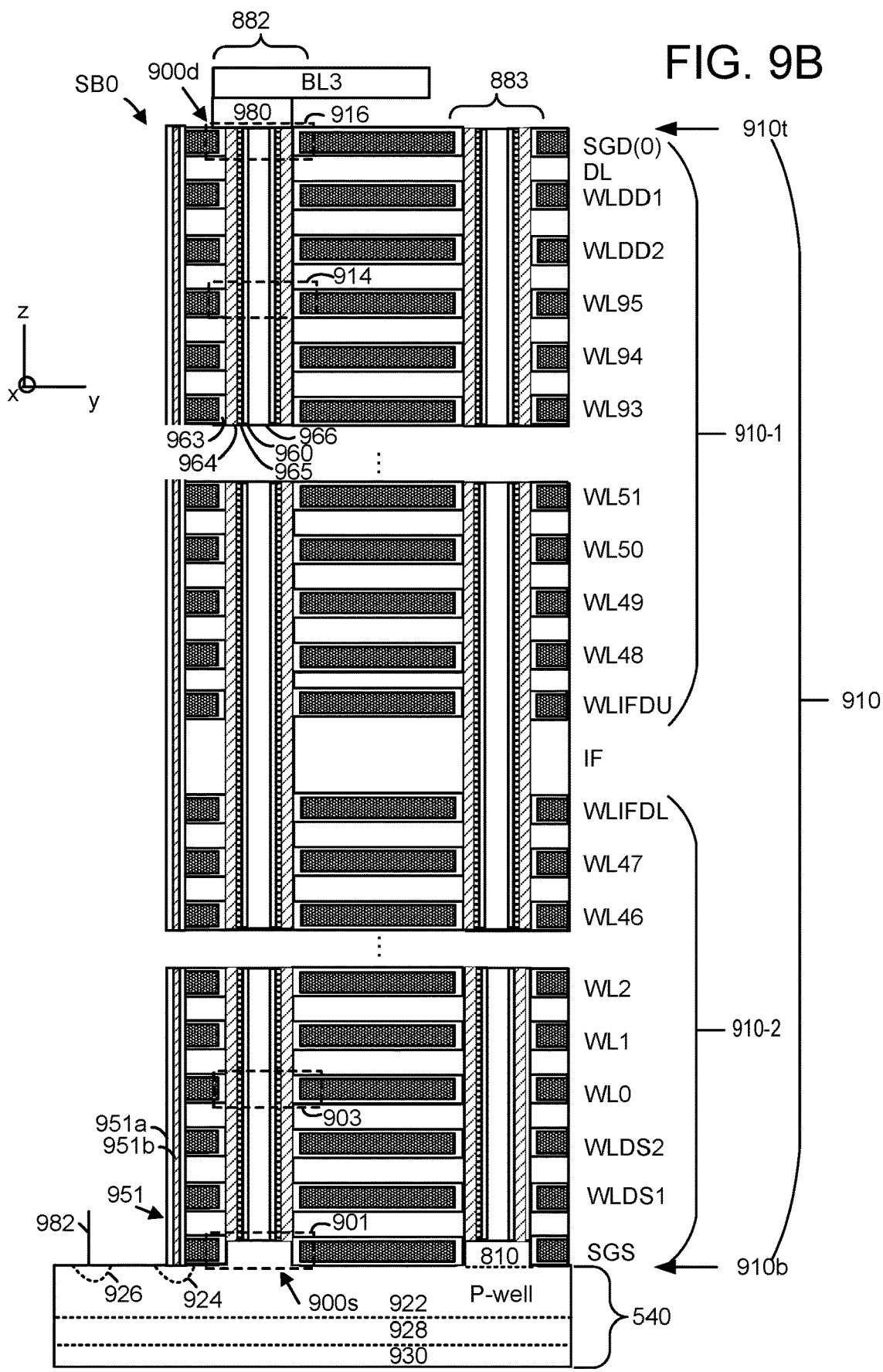

FIG. 9B depicts an example cross-sectional view of a portion of a sub-block, including NAND strings 882 and 883, in a two-tier stack comprising an upper tier 910-1 and a lower tier 910-2. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines.

The configurations of the substrate in FIGS. 9A and 9B may be used when a p-well erase is used. During one embodiment of p-well erase, an erase voltage is applied to the p-well contact 982. The LI 951 may be floated and may couple up to the erase voltage. A depletion region (fully or partially) is formed in the p-well region 922 due to the migration of electrons out of the depletion region toward the n+ contact 924 and thus holes get accumulated. The resulting holes then migrate from the depletion region into the NAND channel 960 to recombine with trapped electrons in the charge storage regions 964 and thus erase the memory cells.

Figure 10:
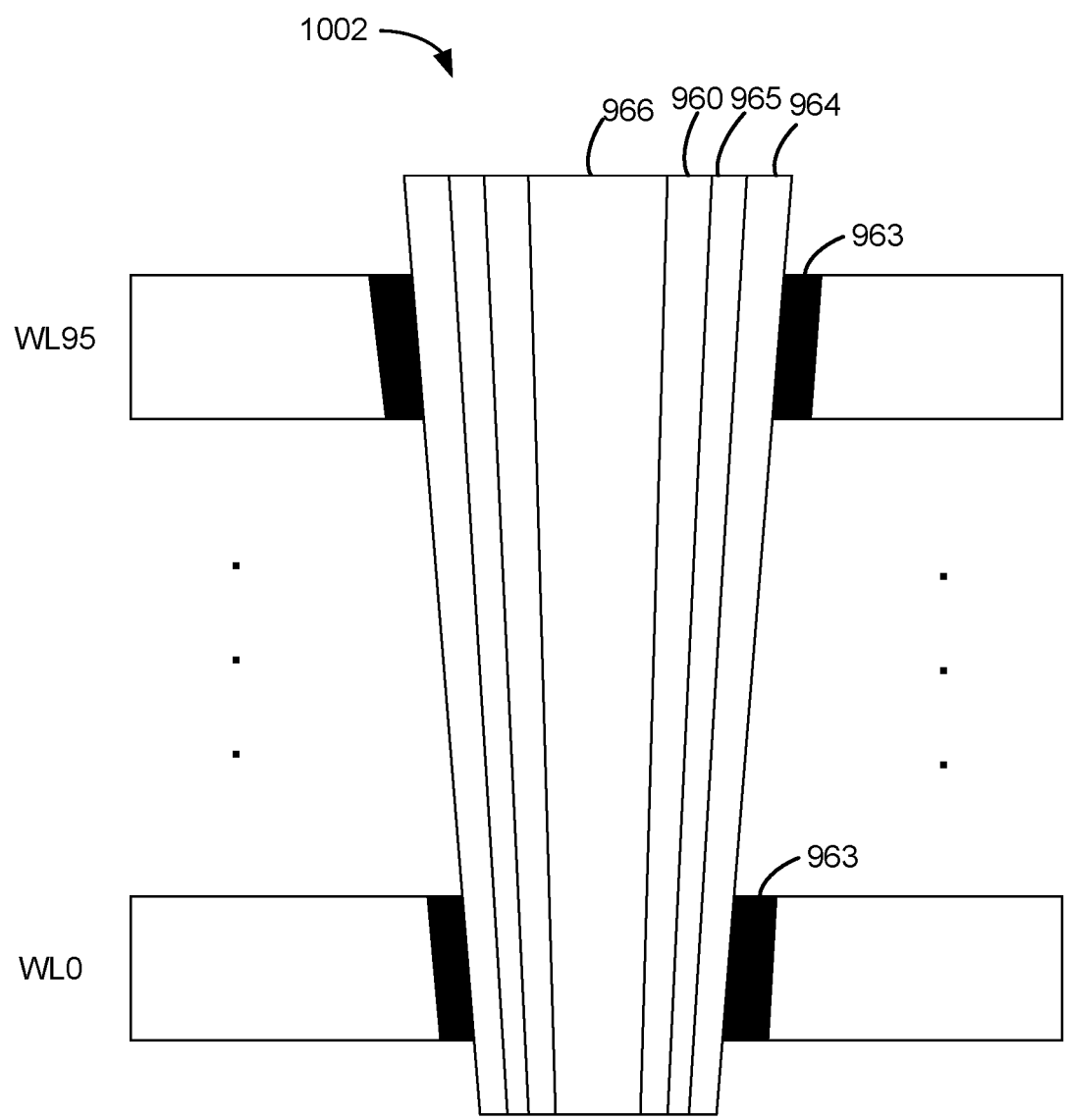
FIG. 10 depicts an example cross-sectional view of a portion of a sub-block, including a NAND string, in a single-tier stack.

Although the columns in which the NAND strings are formed are depicted has having a relatively uniform diameter from top to bottom, the diameter may be non-uniform from top to bottom. FIG. 10 depicts an example cross-sectional view of a portion of a sub-block, including a NAND string, in a single-tier stack. FIG. 10 shows NAND string 1002 and two word lines (WL95, WL0). Other word lines are not depicted in FIG. 10. The charge-trapping layer 964, tunneling layer 965 (e.g., a gate oxide) and a channel 960 (e.g., comprising polysilicon), and dielectric core 966 (e.g., comprising silicon dioxide) are depicted. The blocking oxide layer 963 is depicted between the word line and the charge-trapping layer 964.

With some manufacturing techniques, the diameter of the column in which the NAND string formed gets progressively more narrow at the lower layers. FIG. 10 depicts this narrowing of the column. The rate at which the memory cell degrades may depend on the diameter of the column. In some cases, the memory cells wears out faster if the diameter is narrower. Hence, in the example in FIG. 10, the memory cell at WL0 may wear out faster than the memory cell at WL 95. This principle also applies to the multi-tier configuration of FIG. 9B. In this case, the basic wide to narrow shape may appear in both the upper tier and the lower tier. Thus, for example, memory cells at WL48 may wear faster than memory cells at WL95. Likewise, memory cells at WL0 may wear faster than memory cells at WL47.

A factor in the wear rate is damage to the memory cells due to electrical fields during memory operations (e.g., read, program, erase). In some cases, the memory cells at the smaller diameter of the column wear faster due to a greater electrical field. Embodiments disclosed herein extend the life of a block despite such uneven wear rates within the block.

Figure 11:
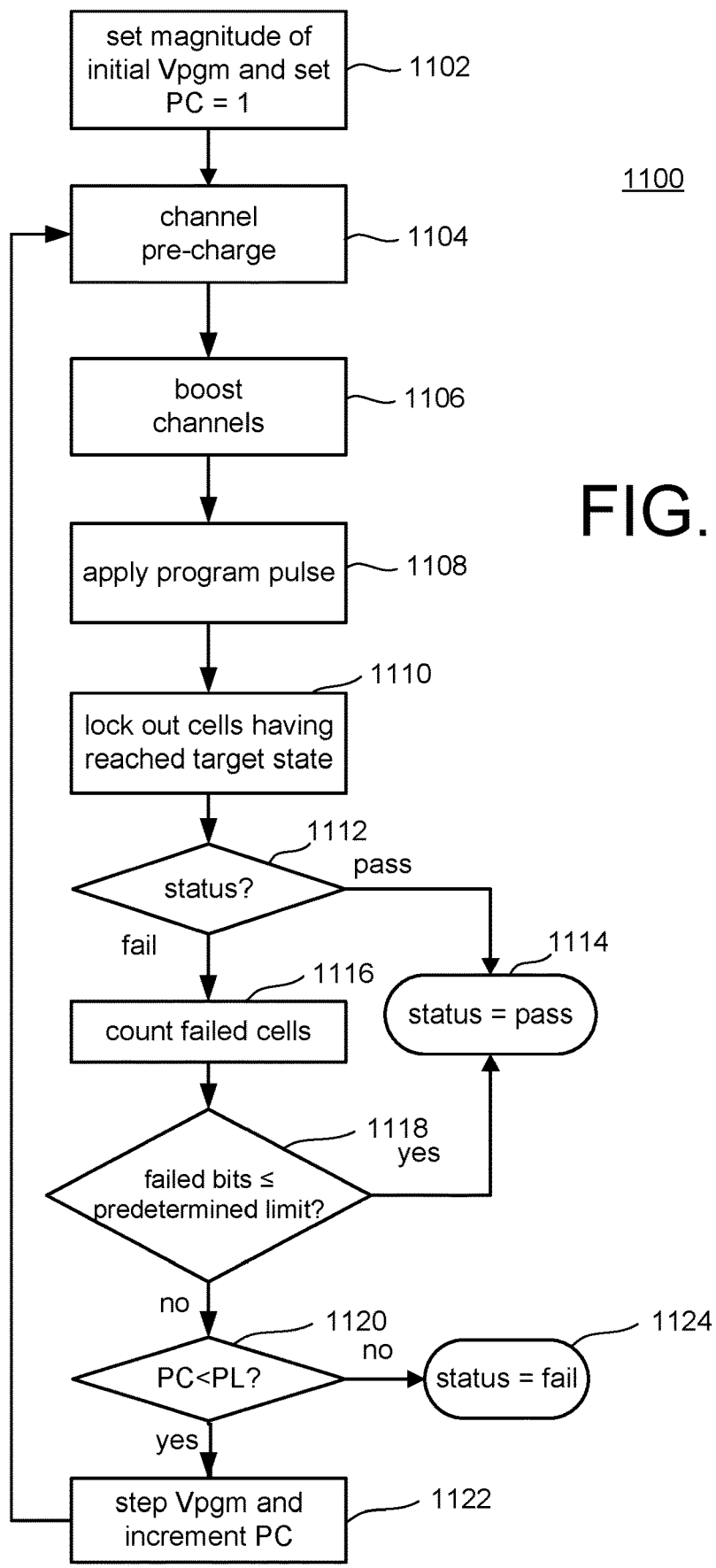
FIG. 11 is a flowchart describing one embodiment of a process for programming NAND strings of memory cells organized into an array.

FIG. 11 is a flowchart describing one embodiment of a process 1100 for programming NAND strings of memory cells organized into an array. The process of FIG. 11 can be performed at the direction of state machine 362. In one example embodiment, the process of FIG. 11 is performed on memory die 300 using the system control logic 360 (and row control circuitry 320, as well as column control circuitry 310) discussed above. In one example embodiment, the process of FIG. 11 is performed by integrated memory assembly 307 using the system control logic 360 discussed above. The process includes multiple loops, each of which includes a program phase (e.g., steps 1104-1108) and a verify phase (e.g., steps 1110-1118).

In many implementations, the magnitude of the program pulses is increased with each successive pulse by a predetermined step size. In step 1102 of FIG. 11, the programming voltage (Vpgm) is initialized to the starting magnitude (e.g., ~12-16V or another suitable level) and a program counter PC maintained by state machine 362 is initialized at 1.

In one embodiment, the set of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1104 the storage system will pre-charge channels of NAND strings that include memory cells connected to the selected word line that are to be inhibited from programming.

In one embodiment, step 1104 is the start of a program operation. In some embodiments, different sets of memory cells are programmed concurrently. For example, programming of memory cells in different memory structures 326 may be performed concurrently. In some embodiments, the start of concurrent program operations (e.g., step 1104) is staggered such that step 1104 occurs at different times for the different memory structures 302.

In step 1106, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 1108, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string."

In step 1108, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 1110, memory cells that have reached their target states are locked out from further programming. Step 1110 may include performing verifying at one or more verify reference levels. In one embodiment, the verification process is performed by testing whether the threshold voltages of the memory cells selected for programming have reached the appropriate verify reference voltage.

In step 1110, a memory cell may be locked out after the memory cell has been verified (by a test of the Vt) that the memory cell has reached its target state.

If, in step 1112, it is determined that all of the memory cells have reached their target threshold voltages (pass), the programming process is complete and successful because all selected memory cells were programmed and verified to their target states. A status of "PASS" is reported in step 1114. Otherwise if, in step 1112, it is determined that not all of the memory cells have reached their target threshold voltages (fail), then the programming process continues to step 1116.

In step 1116, the storage system counts the number of memory cells that have not yet reached their respective target threshold voltage distribution. That is, the system counts the number of memory cells that have, so far, failed to reach their target state. This counting can be done by the state machine 362, the memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 1118, it is determined whether the count from step 1116 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 1114. In this situation, enough memory cells programmed correctly such that the few remaining memory cells that have not been completely programmed can be corrected using ECC during the read process. In some embodiments, the predetermined limit used in step 1118 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 1120 and the program counter PC is checked against the program limit value (PL). Examples of program limit values include 1, 12, 16, 19 and 30; however, other values can be used. If the program counter PC is not less than the program limit value PL, then the program process is considered to have failed and a status of FAIL is reported in step 1124. If the program counter PC is less than the program limit value PL, then the process continues at step 1122 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). In some embodiments, the step size depends on what region (e.g., sub-block) of a block of memory cells is being programmed. The step size may depend on the program/erase count and what region (e.g., sub-block) of a block of memory cells is being programmed. Controlling the step size in this manner extends the life of a block, despite uneven wear rates in the block.

After step 1122, the process loops back to step 1104 and another program pulse is applied to the selected word line so that another iteration (steps 1104-1122) of the programming process of FIG. 11 is performed.

Figure 12:
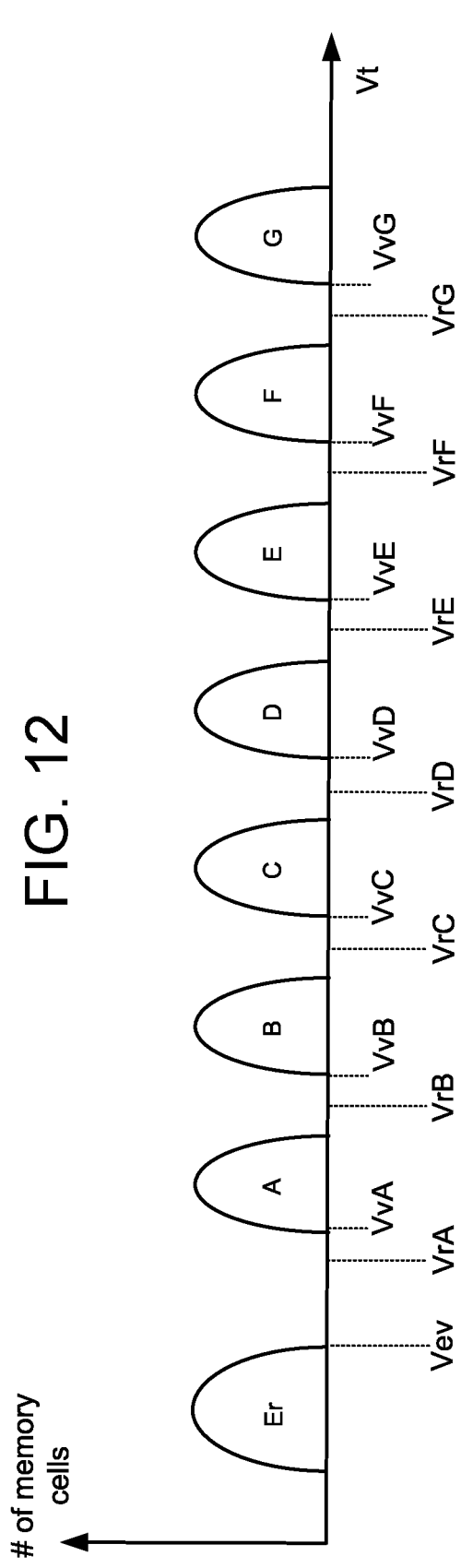
FIG. 12 illustrates example threshold voltage distributions for the memory array when each memory cell stores three bits of data.

At the end of a successful programming process, the threshold voltages of the memory cells should be within one or more distributions of threshold voltages for programmed memory cells or within a distribution of threshold voltages for erased memory cells, as appropriate. FIG. 12 illustrates example threshold voltage distributions for the memory array when each memory cell stores three bits of data. Other embodiments, however, may use other data capacities per memory cell (e.g., such as one, two, four, or five bits of data per memory cell). FIG. 6A shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 12 shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 12 also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 12 also shows Vev, which is a voltage level to test whether a memory cell has been properly erased.

In one embodiment, known as full sequence programming, memory cells can be programmed from the erased data state Er directly to any of the programmed data states A-G. For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state Er to data state B and/or from data state Er to data state C, and so on. In some embodiments, data states A-G can overlap, with control die 311 and/or memory controller 102 relying on error correction to identify the correct data being stored.

The technology described herein can also be used with other types of programming in addition to full sequence programming (including, but not limited to, multiple stage/phase programming). In one embodiment of multiple stage/phase programming, all memory cells to end up in any of data states D-G are programmed to an intermediate state that is no higher than D in a first phase. Memory cells to end up in any of data states Er-C do not receive programming in the first phase. In a second phase, memory cells to end up in either data state B or C are programmed to a state that is no higher than B; memory cells to end up in either data state F or G are programmed to a state that is no higher than F. In a third phase, the memory cells are programmed to their final states. In one embodiment, a first page is programmed in the first phase, a second page is programmed in the second phase, and a third page is programmed in the third phase. Herein, once one page has been programmed into a set of memory cells, the memory cells can be read back to retrieve the page. Hence, the intermediate states associated with multi-phase programming are considered herein to be programmed states.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 12) or verify operation (e.g. see verify target levels VvA, VvB, VvC, VvD, VvE, VvF, and VvG of FIG. 12) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

Figure 13B:
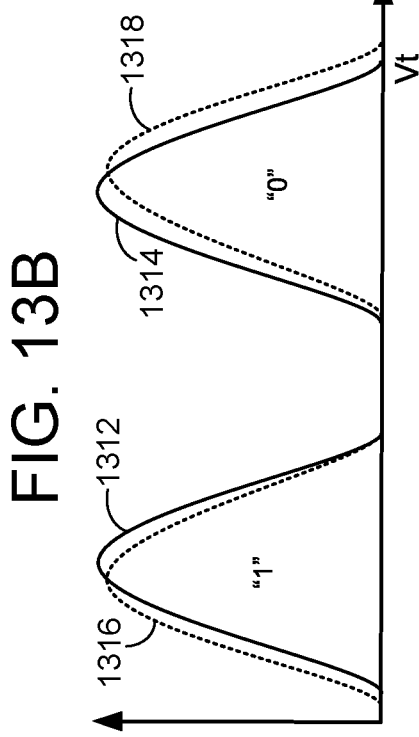
FIGS. 13A and 13B depict Vt distributions over time for memory cells in different regions of a block.
Figure 13A:
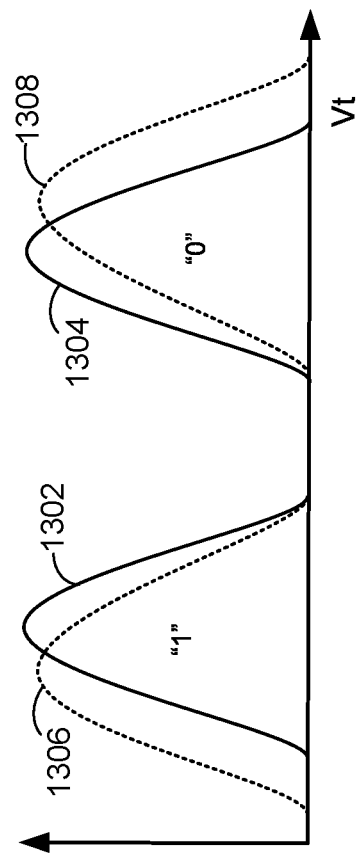

The wear rate of memory cells can affect the shape of the Vt distributions. FIGS. 13A and 13B depict Vt distributions over time for memory cells in different regions of a block. FIG. 13A depicts Vt distributions for memory cells in an outer sub-block. FIG. 13B depicts Vt distributions for memory cells for an inner sub-block. The outer sub-block wears faster than the inner sub-block, in this example. The Vt distributions are for SLC programming, but the concepts may be applied to multi-bit programming.

FIG. 13A shows Vt distribution 1302 (labeled as "1") and Vt distribution 1304 (labeled as "0") when the block is fresh (e.g., close to 0 program erase cycles). FIG. 13A also shows Vt distribution 1306 (labeled as "1) and Vt distribution 1308 (labeled as "0") after the block has been cycled many times (e.g., about 100,000 SLC program/erase). Distribution 1306 is substantially wider than distribution 1302, which is an effect of wear. Distribution 1308 is substantially wider than distribution 1304, which is an effect of wear.

FIG. 13B shows Vt distribution 1312 and Vt distribution 1314 when the block is fresh (e.g., close to 0 program erase cycles). FIG. 13B also shows Vt distribution 1316 and Vt distribution 1318 after the block has been cycled many times (e.g., about 100,000 SLC program/erase). Although distribution 1316 is wider than distribution 1312, the difference is not as great as for the erase distributions 1306, 1302 in FIG. 13A. Likewise, although distribution 1318 is wider than distribution 1314, the difference is not as great as for the erase distributions 1308, 1304 in FIG. 13A. Therefore, the wear rate for the inner sub-block for the example in FIG. 13B is less than the wear rate for the outer sub-block for the example in FIG. 13A. A factor in the lower wear rate for the inner sub-block may be related to the natural Vt. The outer sub-blocks may have a larger natural Vt, which can lead to a larger Vt switch during program, as well as during erase. This may lead to the outer sub-block degrading at a faster rate over the P/E cycles. In some embodiments, block life is extended by managing the outer blocks differently after a threshold number of P/E cycles, which extends the life of the outer sub-blocks (thereby extending the life of the block).

Figure 14:
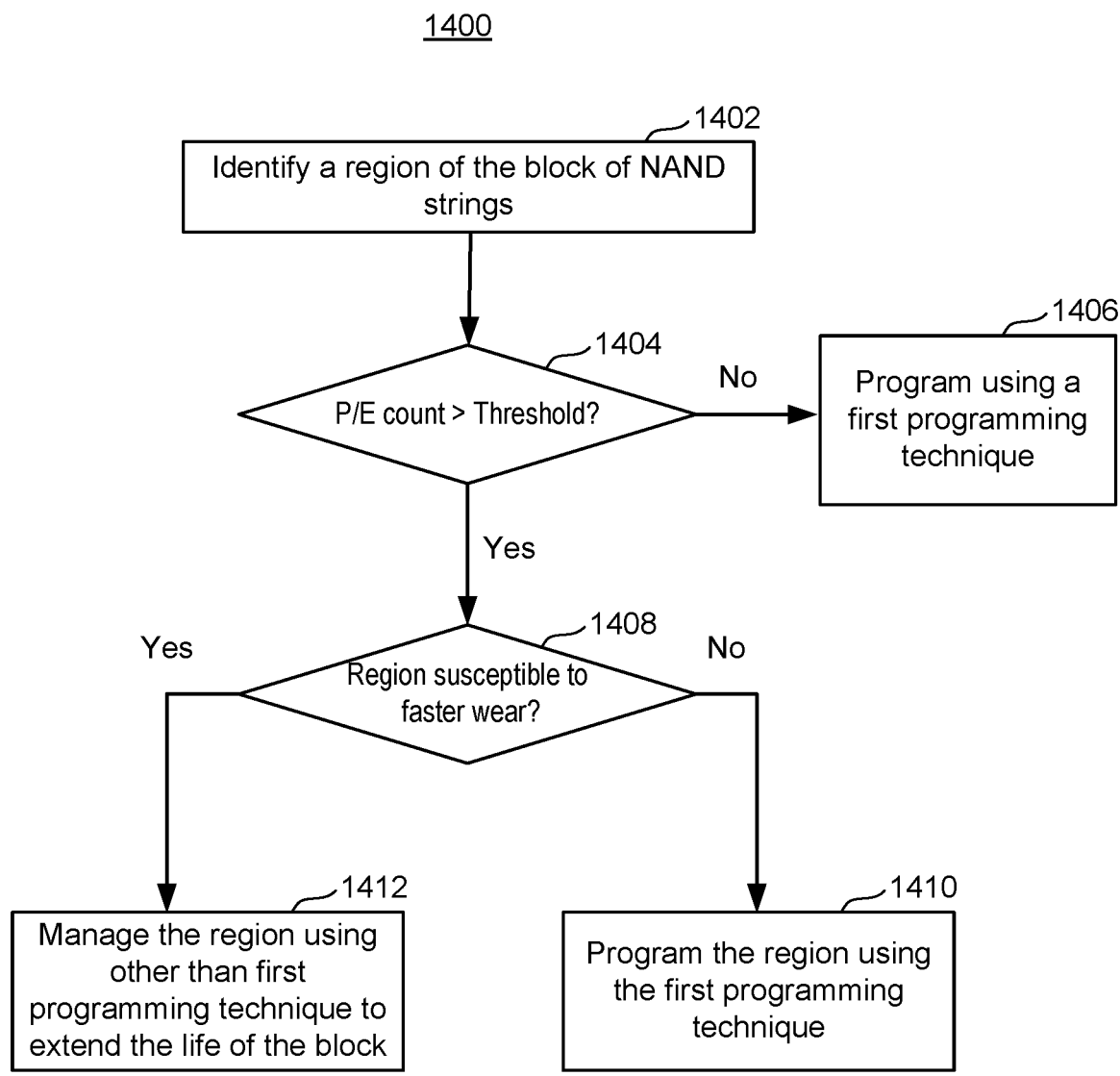
FIG. 14 is flowchart of one embodiment of a process of programming non-volatile memory cells.

FIG. 14 is flowchart of one embodiment of a process 1400 of programming non-volatile memory cells. The process 1400 may be used for SLC or multi-bit (e.g., MLC, TLC, QLC, PLC) programming. The process 1400 may be performed by a combination of memory controller 102, system control logic 360, column control circuitry 310, and/or row control circuitry 320. Step 1402 includes identifying a region in a block of NAND strings. This is a region to potentially be programmed. In an embodiment, the region includes a sub-block. In an embodiment, the region includes a word line. In an embodiment, the region includes a combination of a specific word line in a specific sub-block.

Step 1404 includes determining whether a program/erase (P/E) count is above a threshold. In one embodiment, there is one P/E count for the entire block. In one embodiment, there are multiple P/E counts for the block, with each P/E count being for a different region of the block. For example, each sub-block could have its own P/E count. In one embodiment, the threshold in step 1404 is associated with a wear rate of a region of the block that is susceptible to faster wear. For example, the threshold could be used to determine whether an outer sub-block has reached a limit of the P/E count at which the outer sub-block should be managed differently to extend the life of the outer sub-block. As another example, the threshold could be used to determine whether a word line has reached a limit of the P/E count at which the word line should be managed differently to extend the life of the block. In an embodiment, this threshold is lower than a threshold that is used to determine whether the block should be retired.

If the P/E count is not above the threshold, then in step 1406 the region of the block is programmed using a first programming technique. In one embodiment, the first programming technique includes a program voltage step size (see step 1122 of FIG. 11). In one embodiment, the first programming technique includes programming the memory cells at n bits per cell, where n is an integer greater than 1. However, in some embodiments, SLC programming is used in step 1406. In an embodiment, the first programming technique is not intended to extend the life of the region.

If the P/E count is above the threshold (see step 1404), then in step 1408 a determination is made as to whether the region is susceptible to faster wear than other regions of the block. In an embodiment, the region or regions of the block that are susceptible to faster wear are pre-determined. In one embodiment, outer sub-blocks are susceptible to faster wear than inner sub-blocks. In one embodiment, memory cells having a smaller cross-sectional diameter are susceptible to faster wear than memory cells having a larger cross-sectional diameter. For example, with reference to FIG. 10, memory cells at a lower portion of a vertical column (e.g., WL0) may be susceptible to faster wear than memory cells at a higher portion of the vertical column (e.g., WL95).

If the region is not susceptible to faster wear, then in step 1410 the region is programmed with the first technique. For example, the same program voltage step size may be used regardless of whether the P/E count is above or below the threshold. As another example, the memory cells could be programmed to the same number of bits regardless of whether the P/E count is above or below the threshold.

If the region is susceptible to faster wear, then in step 1412 the region is managed using other than the first programming technique in order to extend the life of the block. In one embodiment of step 1412, a smaller program voltage step size is used (relative to step 1406 or 1410). Using a smaller program voltage step can extend the useful life of this region, which extends the life of the block. However, note that the larger program voltage step size continues to be used in other regions of the block after the P/E count is above the threshold.

In one embodiment of step 1412, the memory cells in the region are programmed to m bits per cell, where m is a positive integer less than n. For example, when the P/E count is below the threshold the memory cells may be programmed to two bits per cell (in step 1406), whereas when the P/E count is above the threshold the memory cells may be programmed to one bit per cell. However, note that memory cells in other regions of the block continued to be programmed to n bits per cell after the P/E count is above the threshold (in step 1410).

In one embodiment of step 1412, the memory cells in the region are programmed to y bits per cell, where y is a positive number less than n. For example, when the P/E count is below the threshold the memory cells may be programmed to 2 bits per cell (in step 1406), whereas when the P/E count is above the threshold the memory cells may be programmed to 1.5 bits per cell. However, note that memory cells in other regions of the block continued to be programmed to n bits per cell after the P/E count is above the threshold (in step 1410). Other examples of going from n bits per cell toy bits per cell are going from 4 bits per cell to 3.5 bits per cell, 3 bits per cell to 2.5 bits per cell, etc.

In one embodiment of step 1412, the different management is to mark the memory cells in the region is ineligible to store data. Hence, when the P/E count is below the threshold data is stored in the memory cells (in step 1406), whereas when the P/E count is above the threshold the memory cells in this region are no longer used to store data. However, note that data is still stored in memory cells in another region after the P/E count is above the threshold. As one example, the region that is marked ineligible to store data may be a word line for which memory cells are susceptible to faster wear. As noted above, a reason for the faster wear could be the thickness of a layer of material (e.g., block layer 963) in the memory cell.

Note that the different management used in step 1412 may be a compromise in that performance in the region may be lower, although life is extended. For example, using a smaller program voltage step can extend the useful life of the region, although programming time could be increased in that region. As another example, decreasing the number of bits per cell can extend the useful life of the region, although this decreases storage capacity in that region. However, by continuing to use the first programming technique in the other regions (those not as susceptible to wear), higher performance is maintained in those regions.

Figure 15:
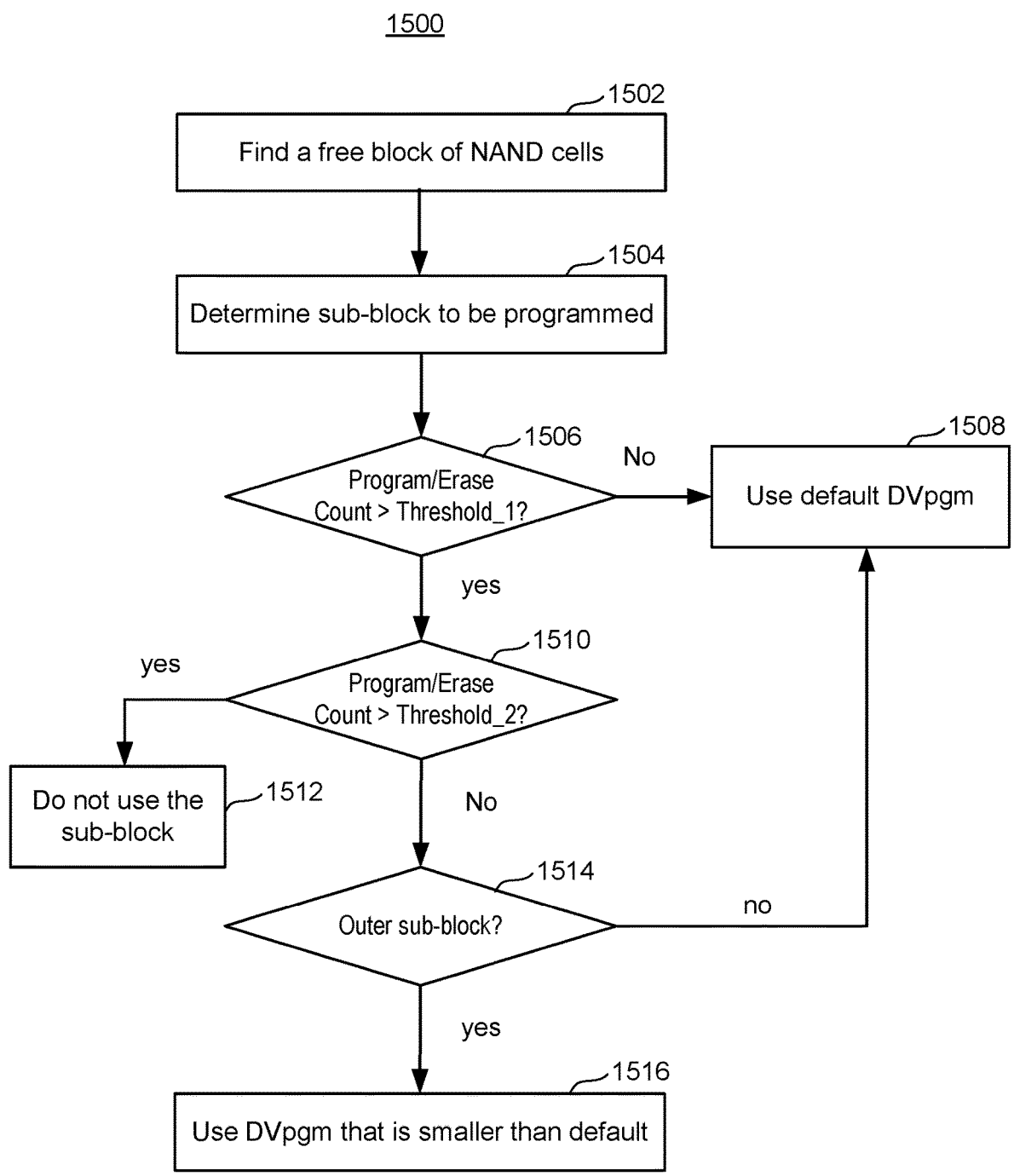
FIG. 15 is a flowchart of one embodiment of a of using a smaller program voltage step size for outer sub-block after a P/E count is above a threshold.

In one embodiment, the region(s) of the block that is/are susceptible to faster wear is an outer sub-block. In one embodiment, when such a region has a P/E count above the threshold (of step 1404), a smaller program step size is used. FIG. 15 is a flowchart of one embodiment of a process 1500 of using a smaller program voltage step size for an outer sub-block after a P/E count is above a threshold. Process 1500 is one embodiment of the process of FIG. 14. The process 1500 may be performed by a combination of memory controller 102, system control logic 360, column control circuitry 310, and/or row control circuitry 320.

Step 1502 includes finding a free block of NAND cells. The memory controller 102 may store a list of blocks that have already been erased, and a hence ready for programming. Step 1504 includes determining a sub-block to be programmed.

Step 1506 includes determining whether a P/E count is over a first threshold (Threshold_1). In an embodiment, the P/E count is the P/E count of the block. In an embodiment, the P/E is a P/E count of the sub-block. Note that process 1500 refers to a first threshold in step 1506 and a second threshold in step 1510. In one embodiment, the first threshold is lower than the second threshold. If the P/E count is not over the first threshold, then in step 1508 the sub-block is programmed using a default program voltage step size (DVpgm). An example of the default program voltage step size is 0.6V, but this could be larger or smaller.

If the P/E count is over the first threshold, then in step 1510 the P/E count is compared to a second threshold (Threshold_2). If the P/E count is over the second threshold, then in step 1512 a determination is made to not use this block. Hence, if the P/E count is higher than the greater of the two thresholds, then the block is not used. In an embodiment, this block is retired.

If the P/E count is not over the second threshold, then in step 1514 a determination is made whether this is an outer sub-block. In some embodiments, outer sub-blocks are subject to faster wear than inner sub-blocks. If this is an outer sub-block, then in step 1516 the sub-block is programmed using a program voltage step size that is smaller than the default. As one example, the default is 0.6V and the DVpgm in step 1516 is 0.3 V. However, other values could be used for DVpgm. If this is not an outer sub-block (e.g., inner sub-block, then in step 1508 the sub-block is programmed using the default program voltage step size.

Although process 1500 provides an example in which the outer sub-block is subject to faster wear than the inner sub-block(s), depending on the architecture and operating conditions, the inner sub-blocks could be subject to faster wear than the outer sub-blocks. Hence in one embodiment, step 1514 is modified to test for an inner sub-block. In an architecture with five sub-blocks such as in FIG. 8B, this could be the innermost sub-block (region 840) or all inner sub-blocks (regions 830, 840, 850). More generally, step 1514 could test for any sub-block, where sub-blocks are defined by different sets of NAND strings in block.

Figure 16:
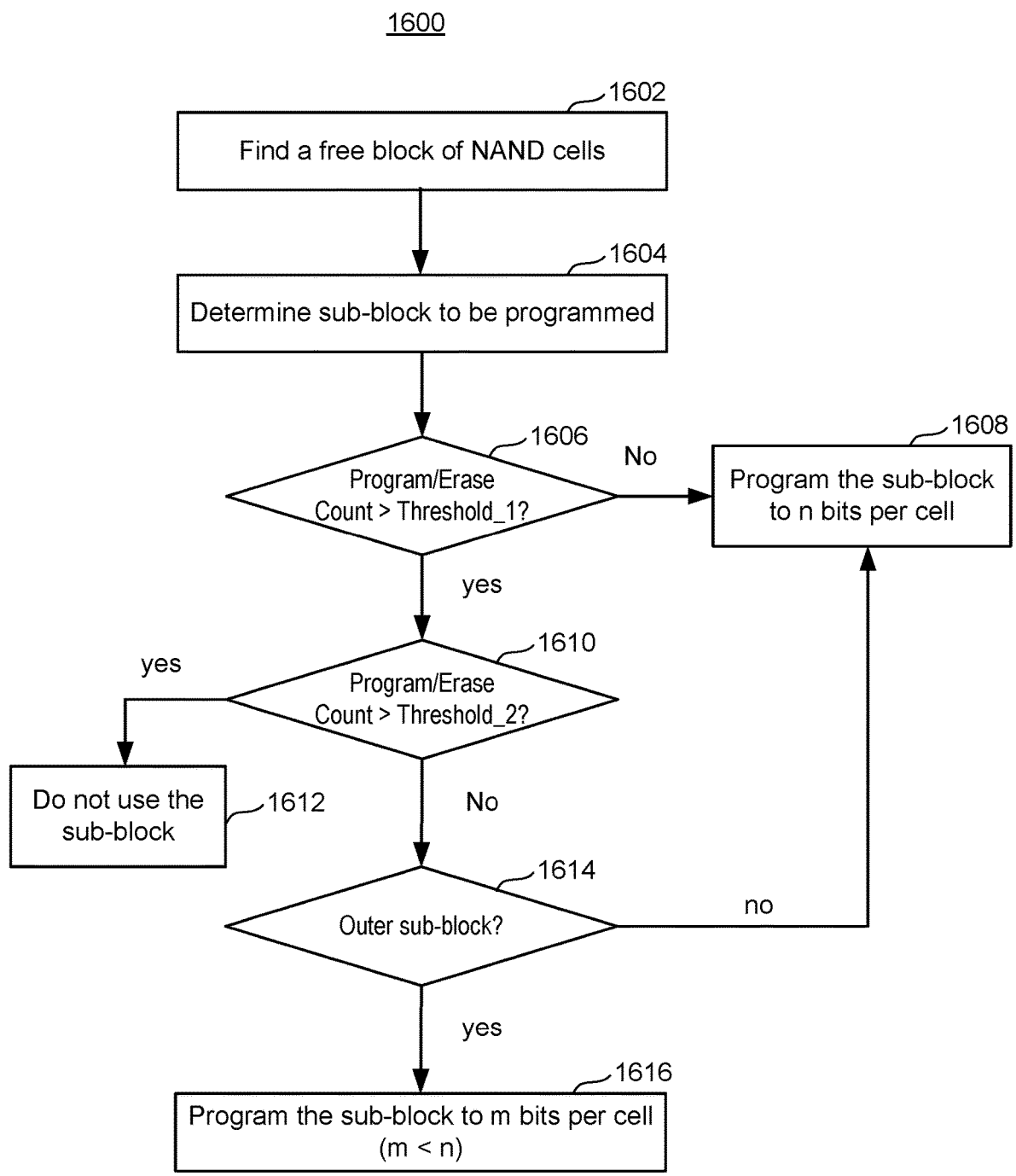
FIG. 16 is a flowchart of one embodiment of a process of programming outer sub-blocks to fewer bits per memory cell after a P/E count is above a threshold.

In one embodiment, the region(s) of the sub-block that is/are susceptible to faster wear is an outer sub-block. In one embodiment, when such a region has a P/E count above the threshold (of step 1404), the memory cells are programmed to a fewer number of bits per cell than when the P/E count is below the threshold. FIG. 16 is a flowchart of one embodiment of a process 1600 of programming outer sub-blocks to fewer bits per memory cell after a P/E count is above a threshold. Process 1600 is one embodiment of the process of FIG. 14. The process 1600 may be performed by a combination of memory controller 102, system control logic 360, column control circuitry 310, and/or row control circuitry 320.

Step 1602 includes finding a free block of NAND cells. The memory controller 102 may store a list of blocks that have already been erased, and a hence ready for programming. Step 1604 includes determining a sub-block to be programmed.

Step 1606 includes determining whether a P/E count is over a first threshold (Threshold_1). Note that process 1600 refers to a first threshold in step 1606 and a second threshold in step 1610. In one embodiment, the first threshold is lower than the second threshold. If the P/E count is not over the first threshold, then in step 1608 the sub-block is programmed to n bits per cell, where n is an integer greater than 1.

If the P/E count is over the first threshold, then in step 1610 the P/E count is compared to a second threshold (Threshold_2). If the P/E count is over the second threshold, then in step 1612 a determination is made to not use this block. Hence, if the P/E count is higher than the greater of the two thresholds, then the block is not used. In an embodiment, this block is retired.

If the P/E count is not over the second threshold, then in step 1614 a determination is made whether this is an outer sub-block. In some embodiments, outer sub-blocks are subject to faster wear than inner sub-blocks. If this is an outer sub-block, then in step 1616 the sub-block is programmed to m bits per cell, where m is a positive integer less than n. The following are examples of m being a positive integer less than n: SLC<MLC, SLC<TLC, SLC<QLC, SLC<PLC, MLC<TLC, MLC<QLC, MLC<PLC, TLC<QLC, TLC<PLC, and QLC<PLC. If this is not an outer sub-block (e.g., inner sub-block, then in step 1608 the sub-block is programmed at n bits per cell. A variation of step 1616 is to program the memory cells to y bits per cell in step 1616, where y is a positive number less than n. In some embodiments, y is a positive number less than n and is a multiple of 0.5.

Although process 1600 provides an example in which the outer sub-block is subject to faster wear than the inner sub-block, depending on the architecture and operating conditions, the inner sub-blocks could be subject to faster wear than the outer sub-blocks. Hence in one embodiment, step 1614 is modified to test for an inner sub-block. In an architecture with five sub-blocks such as in FIG. 8B, this could be the innermost sub-block (region 840) or all inner sub-blocks (regions 830, 840, 850). More generally, step 1614 could test for any sub-block, where sub-blocks are defined by different sets of NAND strings in block.

In one embodiment, memory cells connected to certain word lines are subject to faster wear than memory cells connected other word lines in that block. For example, memory cells having a smaller cross-sectional diameter may be susceptible to faster wear than memory cells having a larger cross-sectional diameter. As one example, the memory cells may be on vertically extending NAND strings that reside in vertical columns having a non-uniform diameter from top to bottom. For example, with reference to FIG. 10, memory cells at a lower portion of a vertical column (e.g., WL0) might be susceptible to faster wear than memory cells at a higher portion of the vertical column (e.g., WL95). A possible factor in the wear rate is the thickness of one or more of the films (e.g., 963, 964, 965, 966) used to form the memory cells.

Figure 17:
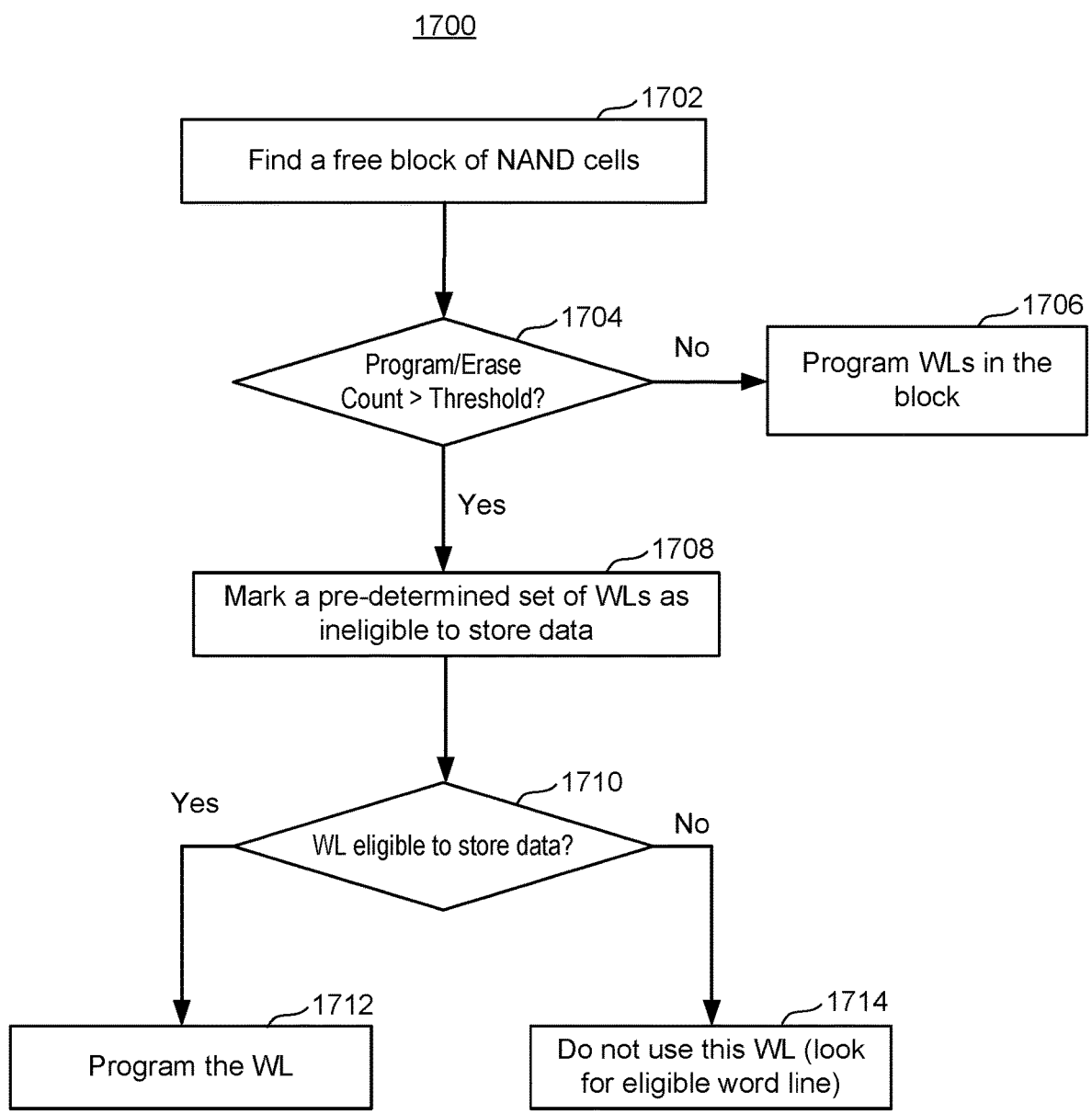
FIG. 17 is a flowchart of one embodiment of a process of marking memory cells connected to certain word lines as ineligible to store data in response to a P/E count hitting a threshold.

FIG. 17 is a flowchart of one embodiment of a process 1700 of marking memory cells connected to certain word lines as ineligible to store data in response to a P/E count hitting a threshold. In an embodiment, these word lines a connected to memory cells that have a faster wear rate than memory cells connected to other word lines. Note that these word lines may be pre-determined. For example, this could be the same numbered word lines in each block. Process 1700 is one embodiment of the process of FIG. 14. The process 1700 may be performed by a combination of memory controller 102, system control logic 360, column control circuitry 310, and/or row control circuitry 320.

Step 1702 includes finding a free block of NAND cells. The memory controller 102 may store a list of blocks that have already been erased, and a hence ready for programming. Step 1704 includes determining whether a P/E count is over a threshold. If not, then in step 1706 the word lines in the block are programmed.

If the P/E count is over the threshold, then in step 1708 a pre-determined set of word lines in the block are marked as ineligible to store data. The set includes one or more word lines. However, other word lines in the block remain eligible for storing data. Hence, this may be referred to as entering a partial block mode of operation.

In an embodiment, the set of word lines in the block that are marked as ineligible to store data are those for which memory cells are subject to faster wear (relative to other word lines in the block). In one embodiment, the memory cells are on vertically extending NAND strings, which reside in vertical columns having non-uniform diameter from top to bottom. Memory cells that are formed at the more narrow part of the vertical columns may wear faster than memory cells formed at the wider part of the columns. As noted above, memory cells that are formed at the more narrow part of the vertical columns may receive more damage due to an electric field during operation. Hence, the word lines that are marked as ineligible to store data may correspond to those memory cells formed at the more narrow part of the vertical columns. However, another factor may be used to select which word lines are to be marked as ineligible to store data.

In step 1710, a determination is made of whether a word line is eligible to store data. If the word line is eligible to store data, then in step 1712 data is programmed into memory cells connected to the word line. If the word line is ineligible to store data, then in step 1714 a determination is made to not store data into this word line. Instead, the system looks for an eligible word line in which to store data. Thus, as can be seen, the life of the block is extended by operating in this partial block mode, as opposed to retiring the block if the P/E reaches the threshold in step 1704. There may be a larger P/E count for deciding when to retire the block. Note that by operating in the partial block mode, this in effect uses different thresholds for retiring different word lines, which extends the life of the block as the system does not need to use a low (or conservative) threshold to account for the worst case (i.e., faster wearing word lines).

As noted, memory cells connected to certain word lines may be subject to faster wear than memory cells connected other word lines in that block. In one embodiment, such memory cells are programmed to fewer bits per memory cell in response to a P/E count exceeding a threshold.

Figure 18:
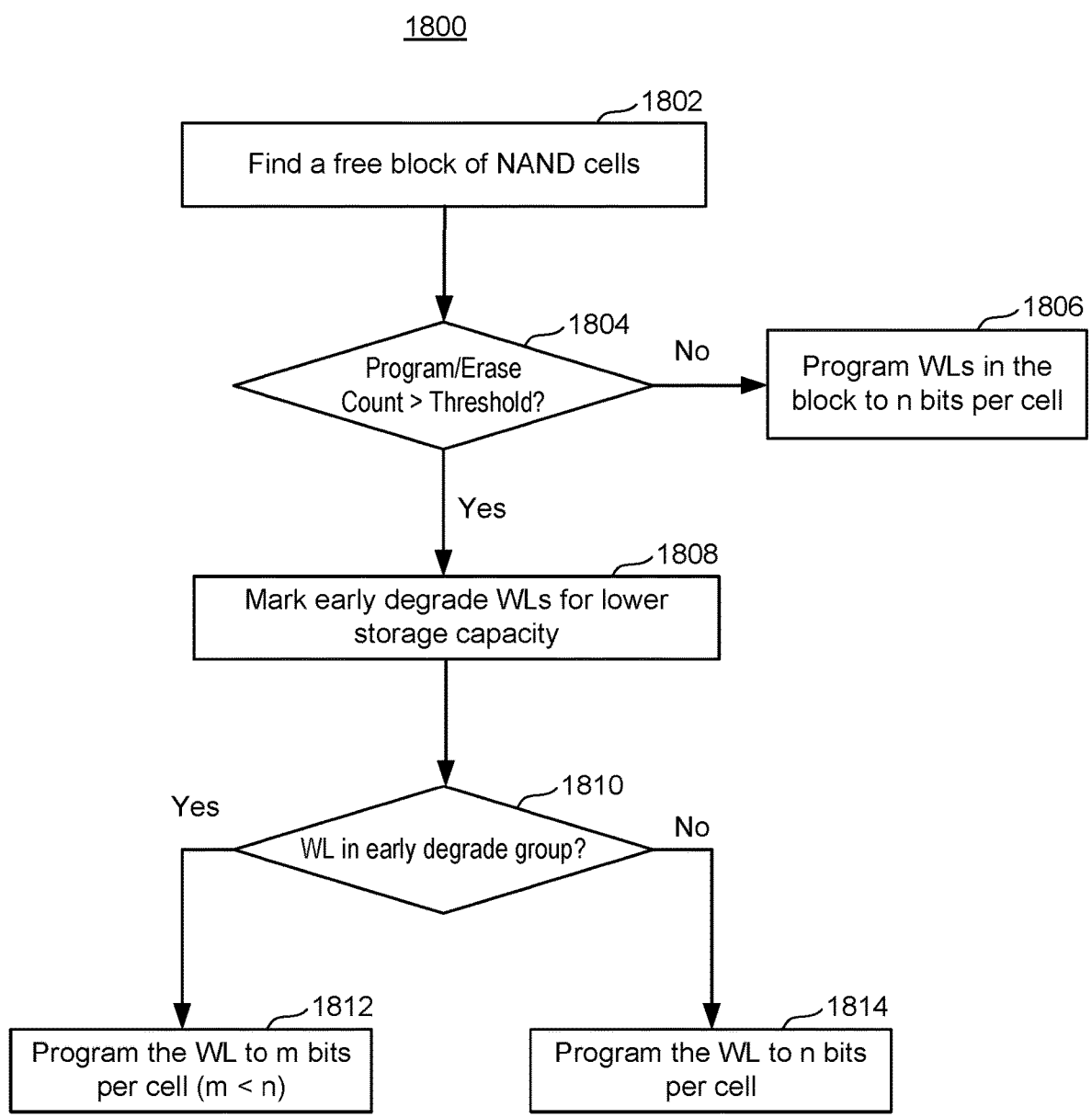
FIG. 18 is a flowchart of one embodiment of a process of programming memory cells to fewer bits per cell in response to a P/E count hitting a threshold.

FIG. 18 is a flowchart of one embodiment of a process 1800 of programming memory cells to fewer bits per cell in response to a P/E count hitting a threshold. Process 1800 is one embodiment of the process of FIG. 14. The process 1800 may be performed by a combination of memory controller 102, system control logic 360, column control circuitry 310, and/or row control circuitry 320. Step 1802 includes finding a free block of NAND cells. Step 1804 includes determining whether a P/E count is over a threshold. In an embodiment, this is a P/E count of the block. If the P/E count is not over the threshold, then the memory cells in the block are programmed to n bits per cell, where n is an integer greater than 1. This programming to n bits per cell is performed regardless of what word line is being programmed.

If the P/E count is over the threshold, then in step 1808 a pre-determined set of word lines in the block are marked for lower storage capacity. The set includes one or more word lines. However, other word lines in the block remain at the previous storage capacity of n bits per cell (see step 1806). This set of word lines may be determined in a similar manner as the set that are determined in step 1708 of FIG. 17.

In step 1810, a determination is made of whether a word line is in the early degrade group. If the word line is in the early degrade group, then in step 1812 the word line is programmed to m bits per cell, where m is a positive integer less than n. The following are examples of m being a positive integer less than n: SLC<MLC, SLC<TLC, SLC<QLC, SLC<PLC, MLC<TLC, MLC<QLC, MLC<PLC, TLC<QLC, TLC<PLC, and QLC<PLC. If word line is not in the early degrade group, then in step 1814 the word line is programmed at n bits per cell. In an alternative embodiment of step 1812, the memory cells are programmed to y bits per cell, where y is a positive number less than n. In one embodiment, y is a positive number less than n and is a multiple of 0.5.

Numerous examples have been provided herein in which the trigger condition to manage a pre-determined region of a block differently is a P/E count. In one embodiment, the trigger condition for determining when to lower the storage capacity of a memory cell is based on a wear condition of the memory cell. The wear condition could be the P/E count, but is not required to be. As memory cells wear, the characteristics of the Vt distributions may change. Hence, the Vt distributions can be analyzed to determine whether a wear condition is met.

Figure 19:
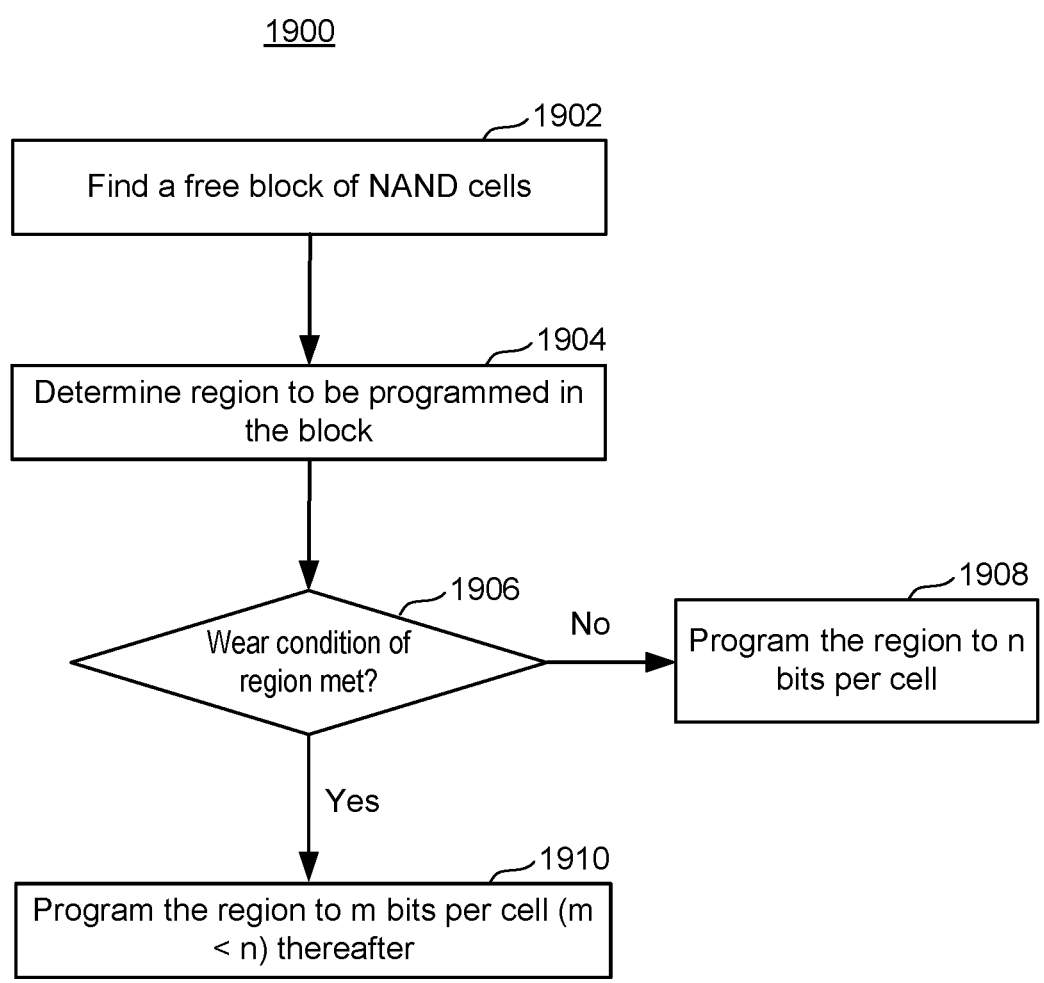
FIG. 19 is a flowchart of one embodiment of a process of changing storage capacity of memory cells based on a wear condition.

FIG. 19 is a flowchart of one embodiment of a process 1900 of changing storage capacity of memory cells based on a wear condition. Process 1900 is one embodiment of the process of FIG. 14. The process 1900 may be performed by a combination of memory controller 102, system control logic 360, column control circuitry 310, and/or row control circuitry 320. Step 1902 includes finding a free block of NAND cells. Step 1904 includes determining a region to be programming in the block. In one embodiment, the region is a sub-block that comprises a set of NAND strings. In one embodiment, the region includes memory cells connected to a word line.

Step 1906 is a determination of whether a wear condition in the region is met. In one embodiment, the wear condition is a P/E count for the region. This could be a P/E count for the block, or it could be a P/E count of the region if there are different P/E counts for different regions of the block. In one embodiment, step 1906 includes the system reading memory cells in the region to determine whether the wear condition is met based on threshold voltages of the memory cells. This may be done periodically after the memory cells are programmed. For example, after each x times (x could be 10, 100, 1000, or any other value) that the region is programmed, the system may read the memory cells immediately after programming to determine the wear condition. The system may store this condition to be applied the next time that the region is programmed.

In one embodiment, wear condition is related to the amount of spread of the Vt distributions. For example, FIG. 13A shows that Vt distribution 1306 is wider than Vt distribution 1302. FIG. 13A also shows that Vt distribution 1308 is wider than Vt distribution 1304. In one embodiment, the system measures the width of one or more Vt distributions to determine the amount of wear. In one embodiment, the system counts the number of memory cells having a Vt in a certain region that is indicative of the Vt distribution spreading out. A count that is higher than some threshold indicates that the wear condition is met.

If the wear condition is not met, then in step 1908 the memory cells in the region are programmed to n bits per cell, where n is an integer greater than 1. If the wear condition is met, the memory cells in the region are programmed in step 1910 to m bits per cell, where m is a positive integer less than n. The previous examples of m being a positive integer less than n discussed in connection with FIG. 16 apply to process 1900. In an alternative embodiment to step 1910, the memory cells are programmed to y bits per cell, where y is a positive number less than n.

In view of the foregoing, it can be seen that one embodiment includes an apparatus, comprising a control circuit configured to connect to a three-dimensional memory structure comprising blocks comprising word lines and non-volatile memory cells arranged as NAND strings. The control circuit is configured to program a block using a first programming technique when a program/erase count of the block is below a threshold, including programming a first pre-determined region of the block using the first programming technique and programming a second pre-determined region using the first programming technique. The control circuit is configured to manage the first pre-determined region with other than the first programming technique after the program/erase count of the first pre-determined region reaches the threshold in order to extend life of the block. The control circuit is configured to program the second predetermined region of the block with the first programming technique after the program/erase count of the second pre-determined region reaches the threshold.

In a second embodiment, in furtherance of the first embodiment, the block comprises a plurality of sub-blocks, and each sub-block comprises sets of NAND strings. The first pre-determined region of the block comprises a first sub-block that comprises first sets of NAND strings. The second pre-determined region of the block comprises a second sub-block that comprises second sets of NAND strings.

In a third embodiment, in furtherance of the second embodiment, the plurality of sub-blocks comprise two outer sub-blocks and at least one inner sub-block that resides between the two outer sub-blocks. The first sub-block is an outer sub-block. The second sub-block is an inner sub-block.

In a fourth embodiment, in furtherance of the second embodiment, the first programming technique comprises a first step size of a program voltage. Managing the first pre-determined region with other the first programming technique comprises a second step size of the program voltage that is smaller than the first step size.

In a fifth embodiment, in furtherance of any of the second embodiment, the first programming technique comprises programming non-volatile memory cells to n bits per memory cell, wherein n is an integer greater than 1. Managing the first pre-determined region with other the first programming technique comprises programming non-volatile memory cells to y bits per memory cell, wherein y is a positive number less than n.

In a sixth embodiment, in furtherance of any of the first to fifth embodiments, the first programming technique comprises a first step size of a program voltage. Managing the first pre-determined region with other the first programming technique comprises a second step size that is smaller than the first step size.

In a seventh embodiment, in furtherance of any of the first to sixth embodiments, the first pre-determined region of the block comprises a first set of the word lines of the block. The second pre-determined region of the block comprises a second set of the word lines of the block.

In an eighth embodiment, in furtherance of the seventh embodiment, the first programming technique comprises programming non-volatile memory cells to n bits per memory cell, wherein n is an integer greater than 1. Managing the first pre-determined region with other the first programming technique comprises programming non-volatile memory cells to m bits per memory cell, wherein m is a positive integer less than n.

In a ninth embodiment, in furtherance of the seventh embodiment, the first programming technique comprises programming non-volatile memory cells on the second set of the word lines. Managing the first pre-determined region with other the first programming technique comprises marking the first set of the word lines as ineligible to store data.

In a tenth embodiment, in furtherance of any of the ninth embodiment, the first programming technique comprises programming non-volatile memory cells to n bits per memory cell, wherein n is an integer greater than 1. Managing the first pre-determined region with other the first programming technique comprises programming non-volatile memory cells to m bits per memory cell, wherein m is a positive integer less than n.

One embodiment includes a method of operating non-volatile storage. The method comprises programming a first sub-block of a block of non-volatile memory cells with a first programming technique prior to a program/erase count of the block exceeding a threshold. The method comprises programming a second sub-block of the block with the first programming technique prior to the program/erase count of the block reaching the threshold. The block comprises NAND strings of the memory cells. The first sub-block comprises a first set of the NAND strings and the second sub-block comprises a second set of the NAND strings. The method comprises programming the first sub-block with a second programming technique in response to the program/erase count of the block exceeding the threshold. The second programming technique extends life of the first sub-block. The method comprises programming the second sub-block with the first programming technique after the program/erase count exceeds the threshold.

One embodiment includes a non-volatile storage system, comprising a memory structure comprising blocks of vertically extending NAND strings that comprise non-volatile memory cells. The storage system comprises a control circuit in communication with the memory structure. The control circuit programs non-volatile memory cells in a first pre-determined region of a selected block to n bits per memory cell prior to a wear condition of a first pre-determined region of the selected block being met, wherein n is an integer greater than 1. The control circuit programs the first pre-determined region of the selected block to m bits per memory cell after the wear condition is met, wherein m is a positive integer less than n. The control circuit programs a second pre-determined region in the block to n bits per cell both prior to and after the wear condition is met in the first pre-determined region of the selected block.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:

a control circuit configured to connect to a three-dimensional memory structure comprising blocks comprising word lines and non-volatile memory cells arranged as NAND strings, each block comprising a plurality of select lines and a corresponding plurality of sub-blocks, each select line configured to select a sub-block, each sub-block comprising sets of NAND strings;

wherein the control circuit is configured to:

program a block using a first programming technique when a program/erase count of the block is below a threshold, including programming a first sub-block of the block using the first programming technique and programming a second sub-block using the first programming technique, programming the first sub-block comprising selecting the first sub-block that comprises first sets of NAND strings with a first select line, programming the second sub-block comprising selecting the second sub-block that comprises second sets of NAND strings with a second select line;

manage the first sub-block with other than the first programming technique after the program/erase count of the first sub-block reaches the threshold in order to extend life of the block; and program the second sub-block of the block with the first programming technique after the program/erase count of the second sub-block reaches the threshold.

2. The apparatus of claim 1, wherein:

the plurality of sub-blocks comprise two outer sub-blocks and at least one inner sub-block that resides between the two outer sub-blocks;

the first sub-block is an outer sub-block; and the second sub-block is an inner sub-block.

3. The apparatus of claim 1, wherein:

the first programming technique comprises a first step size of a program voltage; and managing the first sub-block with other the first programming technique comprises a second step size of the program voltage that is smaller than the first step size.

4. The apparatus of claim 1, wherein:

the first programming technique comprises programming non-volatile memory cells on the second set of the word lines; and managing the first sub-block with other the first programming technique comprises marking the first set of the word lines as ineligible to store data.

5. The apparatus of claim 1, wherein:

the first programming technique comprises programming non-volatile memory cells to n bits per memory cell, wherein n is an integer greater than 1; and managing the first sub-block with other the first programming technique comprises programming non-volatile memory cells to m bit or bits per memory cell, wherein m is a positive integer less than n.

6. A method of operating non-volatile storage, the method comprising:

programming a first sub-block of a block of non-volatile memory cells with a first programming technique prior to a program/erase count of the block exceeding a threshold, the first programming technique comprising a first step size of a program voltage;

programming a second sub-block of the block with the first programming technique prior to the program/erase count of the block reaching the threshold, wherein the block comprises NAND strings of the memory cells, wherein the first sub-block comprises a first set of the NAND strings and the second sub-block comprises a second set of the NAND strings;

programming the first sub-block with a second programming technique in response to the program/erase count of the block exceeding the threshold, wherein the second programming technique extends life of the first sub-block, the second programming technique comprising a second step size of the program voltage that is smaller than the first step size; and programming the second sub-block with the first programming technique after the program/erase count exceeds the threshold.

7. The method of claim 6, wherein:

the block comprises a plurality of sub-blocks that comprise two outer sub-blocks and at least one inner sub-block that resides between the two outer sub-blocks;

the first sub-block is an outer sub-block; and the second sub-block is an inner sub-block.

8. A non-volatile storage system, comprising:

a memory structure comprising blocks of vertically extending NAND strings that comprise non-volatile memory cells; and a control circuit in communication with the memory structure, wherein the control circuit:

programs non-volatile memory cells in a first pre-determined region of a selected block to n bits per memory cell prior to a wear condition of a first pre-determined region of the selected block being met, wherein n is an integer greater than 1;

programs the first pre-determined region of the selected block to m bit or bits per memory cell in response to the wear condition being met, wherein m is a positive integer less than n; and programs a second pre-determined region in the selected block to n bits per cell both prior to and after the wear condition is met in the first pre-determined region of the selected block.

9. The non-volatile storage system of claim 8, wherein:

the wear condition is a number of program/erase cycles of the selected block.

10. The non-volatile storage system of claim 8, wherein the control circuit:

reads the memory cells in the first pre-determined region to determine the wear condition based on threshold voltages of the memory cells.

11. The non-volatile storage system of claim 8, wherein:

each block comprises a plurality of sub-blocks, each sub-block comprises sets of NAND strings;

the first pre-determined region of the selected block comprises a first sub-block that comprises first sets of NAND strings; and the second pre-determined region of the selected block comprises a second sub-block that comprises second sets of NAND strings.

12. The non-volatile storage system of claim 8, wherein:

the selected block comprises a plurality of word lines;

the first pre-determined region of the selected block comprises a first set of the word lines; and the second pre-determined region of the selected block comprises a second set of the word lines.

13. The non-volatile storage system of claim 12, wherein:

the vertically extending NAND strings reside in vertical columns having non-uniform diameter from top to bottom;

the first pre-determined region comprises memory cells for which the vertical columns have a first diameter; and the second pre-determined region comprises memory cells for which the vertical columns have a second diameter that is greater than the first diameter.

\* \* \* \* \*